United States Patent
Yamanaka et al.

(10) Patent No.: US 8,460,954 B2
(45) Date of Patent: Jun. 11, 2013

(54) SEMICONDUCTOR DEVICE, METHOD FOR MANUFACTURING SAME, AND DISPLAY DEVICE

(75) Inventors: Masaki Yamanaka, Osaka (JP); Hiroshi Nakatsuji, Osaka (JP); Naoki Makita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 194 days.

(21) Appl. No.: 13/125,776

(22) PCT Filed: Oct. 22, 2009

(86) PCT No.: PCT/JP2009/005575
§ 371 (c)(1),
(2), (4) Date: Apr. 22, 2011

(87) PCT Pub. No.: WO2010/050161
PCT Pub. Date: May 6, 2010

(65) Prior Publication Data
US 2011/0198608 A1 Aug. 18, 2011

(30) Foreign Application Priority Data

Oct. 27, 2008 (JP) .................................. 2008-276023

(51) Int. Cl.
*H01L 21/00* (2006.01)
*H01L 21/20* (2006.01)
*H01L 21/36* (2006.01)
*H01L 27/14* (2006.01)
*H01L 29/04* (2006.01)
*H01L 29/15* (2006.01)
*H01L 31/036* (2006.01)

(52) U.S. Cl.
USPC .................. 438/30; 438/71; 438/487; 257/72

(58) Field of Classification Search
USPC .......................... 257/66, 72; 438/30, 71, 487
See application file for complete search history.

(56) References Cited

U.S. PATENT DOCUMENTS 7,358,165 B2 4/2008 Shoji et al.
8,059,222 B2 * 11/2011 Katoh et al. .................... 349/43

(Continued)

FOREIGN PATENT DOCUMENTS

| JP | 1988-27066 U | 2/1988 |
| JP | H6-275807 A | 9/1994 |

(Continued)

OTHER PUBLICATIONS

International Search Report (ISR) issued in PCT/JP2009/005575 (International application) mailed in Dec. 2009 for Examiner consideration, citing U.S. Patent Application Publication Nos. 1-3 and Foreign Patent document Nos. 4-8.

(Continued)

*Primary Examiner* — Cheung Lee
*Assistant Examiner* — Jeremy Joy
(74) *Attorney, Agent, or Firm* — Chen Yoshimura LLP

(57) ABSTRACT

A semiconductor device includes a thin film transistor and a thin film diode on a same substrate. A semiconductor layer (109) of the thin film transistor and a semiconductor layer (110) of the thin film diode are crystalline semiconductor layers formed by crystallizing the same non-crystalline semiconductor film. The thickness of the semiconductor layer (110) of the thin film diode is greater than the thickness of the semiconductor layer (109) of the thin film transistor, and the surface of the semiconductor layer (110) of the thin film diode is rougher than the surface of the semiconductor layer (109) of the thin film transistor.

3 Claims, 11 Drawing Sheets

U.S. PATENT DOCUMENTS

| | | | |
|---|---|---|---|
| 8,415,678 B2 * | 4/2013 | Yamanaka et al. | 257/72 |
| 2005/0023531 A1 * | 2/2005 | Shoji et al. | 257/70 |
| 2005/0026401 A1 * | 2/2005 | Shimomura et al. | 438/487 |
| 2005/0045881 A1 | 3/2005 | Nakamura et al. | |
| 2008/0164473 A1 * | 7/2008 | Tai et al. | 257/59 |
| 2009/0050891 A1 | 2/2009 | Katoh | |
| 2010/0065851 A1 * | 3/2010 | Makita | 257/72 |
| 2012/0068182 A1 * | 3/2012 | Yamanaka et al. | 257/59 |

FOREIGN PATENT DOCUMENTS

| | | |
|---|---|---|
| JP | H6-275808 A | 9/1994 |
| JP | 2003-249639 A | 9/2003 |
| JP | 2005-72126 A | 3/2005 |
| JP | 2005072126 A * | 3/2005 |
| JP | 2006-3857 A | 1/2006 |
| JP | 2008-171871 A | 7/2008 |
| WO | 2006/129428 A1 | 12/2006 |
| WO | WO 2008132862 A1 * | 11/2008 |
| WO | 20100134571 A1 | 11/2010 |

OTHER PUBLICATIONS

U.S. Appl. No. 13/321,411, filed Nov. 29, 2011.

International Search Report (ISR) issued in PCT/JP2010/058531 of the related U.S. Appl. No. 13/321,411 mailed in Jun. 2010.

* cited by examiner (A)

(B)

(C)

(D)

(E)

(F)

(G)

(H)

(A)

(B)

(C)

(D)

(E)

(F)

(G)

(A)

(B)

(C)

(D)

(E)

SEMICONDUCTOR DEVICE, METHOD FOR MANUFACTURING SAME, AND DISPLAY DEVICE

TECHNICAL FIELD

The present invention relates to a semiconductor device having a thin film transistor (TFT) and a thin film diode (TFD), the method of manufacturing thereof, and a display device.

BACKGROUND ART

Development of semiconductor devices having thin film transistors (TFTs) and thin film diodes (TFDs) formed on the same substrate and electronics systems including such semiconductor devices has been underway in recent years. As a method of manufacturing such a semiconductor device, a method of forming the semiconductor layers for the TFTs and the TFDs using the same crystalline semiconductor film formed on the substrate has been proposed.

Patent Document 1 discloses an image sensor having on the same substrate a photo sensor portion using the TFDs and a driver circuit using the TFTs on the same substrate. According to the Patent Document 1, the semiconductor layers for the TFT and the TFD are formed by crystallizing a non-crystalline semiconductor film formed on the substrate.

There are large cost advantages to forming the TFT and the TFD in a single unit on the same substrate, including a reduction in semiconductor device form factor and component counts. Furthermore, new products can be realized by adding new features which cannot be obtained by combining the conventional parts.

On the other hand, Patent Document 2 discloses the formation of the TFT using the crystalline silicon (crystalline silicon TFT) and the TFD using the non-crystalline silicon (non-crystalline silicon TFD) on the same substrate using the same semiconductor film (non-crystalline silicon film). Specifically, a catalytic element is added for promoting the crystallization of non-crystalline silicon only in the region of the non-crystalline silicon film formed on the substrate in which the active region of the TFT is to be formed. Then, a silicon film is formed such that only the region in which the active region of the TFT is to be formed is crystallized with an anneal process, and the region to be the TFD remains in the amorphous state. Using this silicon film, the crystalline silicon TFT and the non-crystalline silicon TFD can be easily formed on the same substrate.

Furthermore, a photo sensor TFT functioning as a photo sensor and a switching TFT functioning as a switching device are formed using the same semiconductor film (non-crystalline silicon film) in Patent Document 3. More specifically, the channel region of the photo sensor TFT is formed with a non-crystalline silicon film, while the source and drain regions and the active region of the switching TFT are formed with the crystalline silicon film. Furthermore, the non-crystalline silicon film for the channel region of the photo sensor TFT is made thicker than the crystalline silicon film of the active region of the switching TFT in order to enhance the photo sensor sensitivity.

The aforementioned TFTs are created separately using the method described below in Patent Document 3. First, a non-crystalline silicon film is formed on the substrate. Next, the non-crystalline silicon film is made partially thinner using the half exposure technology with a greytone mask for the photolithography for creating an island of non-crystalline silicon film. As a result, a plurality non-crystalline silicon layers having varying thicknesses is obtained. Then, these non-crystalline silicon layers are irradiated with a laser beam to crystallize the regions of the non-crystalline silicon layers which have been made thinner (the source and drain regions of the photo sensor TFT and the region to become the active region of the switching TFT), while the region that has not been made thinner (the region to become the channel region of the photo sensor TFT) remains non-crystalline.

PRIOR ART DOCUMENTS

Patent Documents

Patent Document 1: Japanese Patent Application Laid-Open Publication No. H6-275808
Patent Document 2: Japanese Patent Application Laid-Open Publication No. H6-275807
Patent Document 3: Japanese Patent Application Laid-Open Publication No. 2005-72126

SUMMARY OF THE INVENTION

Problems to be Solved by the Invention

According to Patent Document 1, both the semiconductor layer for the TFT and the semiconductor layer for the TFD are formed by crystallizing the same crystalline semiconductor film. While different device characteristics are required of the TFT and the TFD, depending on their applications, this method faces a problem in that it is difficult to simultaneously satisfy the respective device characteristics required of the TFT and the TFD.

According to the methods disclosed in Patent Document 2 and Patent Document 3, the semiconductor layers of the TFT and TFD having different crystal states are formed from the same non-crystalline semiconductor film. Nevertheless, it is difficult to have the manufacturing process optimize the crystal state of each semiconductor layer. Furthermore, even with the methods disclosed in Patent Documents 2 and 3, it is difficult to obtain the TFT and the TFD having superior characteristics, as will be explained below.

In the method of Patent Document 2, one portion of the same non-crystalline semiconductor film is crystallized, and the TFT (crystalline silicon TFT) is formed from a portion which has been crystallized, while the TFD (non-crystalline silicon TFD) is formed from a portion that remains non-crystalline. According to this method, it is possible to improve the characteristics of the crystalline silicon TFT by controlling the crystallization conditions. However, the hydrogen originally contained in the non-crystalline silicon film is removed during the anneal process for crystallizing a portion of the non-crystalline silicon film into crystalline silicon. For this reason, there is a problem in that it is not possible to manufacture the non-crystalline silicon TFD with good electrical properties using the portion that remains non-crystalline after the anneal step. Although the silicon atoms are bonded with hydrogen, and their dangling bonds are terminated in a non-crystalline film immediately after the deposition, the bonds between the silicon elements and the hydrogen break and the hydrogen is removed during the annealing process for crystallization. As a result, the non-crystalline silicon becomes full of dangling bonds on the silicon atoms and becomes degraded. For a similar reason, it is difficult to obtain a photo sensor TFT (non-crystalline silicon TFT) having good electrical properties using the method in the Patent Document 3.

Accordingly, it is difficult to obtain the characteristics required respectively of the TFT and the TFD, when the conventional semiconductor device is manufactured by creating the TFT and the TFD using the same non-crystalline semiconductor film. As a result, a high performance semiconductor device may not be obtained.

The present invention has been made in consideration of the aforementioned problems with an object of realizing the characteristics required respectively of the thin film transistors and thin film diodes in a semiconductor device having the thin film transistor and the thin film diode on the same substrate.

Means of Solving the Problems

A semiconductor device of the present invention includes a thin film transistor having a semiconductor layer including a channel region, a source region, and a drain region; a gate electrode controlling the conductivity of the aforementioned channel region; and a gate insulating film formed between the aforementioned semiconductor layer and the aforementioned gate electrode; and a thin film diode having a semiconductor layer including at least an n type region and a p type region. The semiconductor layer of the aforementioned thin film transistor and the semiconductor layer of the aforementioned thin film diode are a crystalline semiconductor layer formed by crystallizing the same non-crystalline semiconductor film; the thickness of the semiconductor layer of the aforementioned thin film diode is larger than the thickness of the semiconductor layer of the aforementioned thin film transistor; and the surface of the semiconductor layer of the aforementioned thin film diode is rougher than the surface of the semiconductor layer of the aforementioned thin film transistor.

In one preferred embodiment, the arithmetically averaged surface roughness Ra of the semiconductor layer of the aforementioned thin film diode is greater then the arithmetically averaged surface roughness Ra of the semiconductor layer of the aforementioned thin film transistor.

In one preferred embodiment, the maximum height Rz on the surface of the semiconductor layer of the aforementioned thin film diode is greater than the maximum height Rz of the surface of the semiconductor layer of the aforementioned thin film transistor.

The difference between the thickness of the semiconductor layer of the aforementioned thin film transistor and the thickness of the semiconductor layer of the aforementioned thin film diode may be 5 nm or greater and 25 nm or less.

In a preferred embodiment, ridges are formed on the surfaces of the semiconductor layer of the aforementioned thin film transistor and the semiconductor layer of the aforementioned thin film diode, and the average height of the ridges formed on the surface of the semiconductor layer of the aforementioned thin film diode is larger than the average height of ridges formed on the surface of the semiconductor layer of the aforementioned thin film transistor.

In a preferred embodiment, the aforementioned ridges are present on the boundaries of the crystal grains included in the aforementioned semiconductor layer.

The aforementioned thin film diode further includes an intrinsic region positioned between the aforementioned n type region and the aforementioned p type region in the semiconductor layer of the aforementioned thin film diode, and the surface of at least the aforementioned intrinsic region in the semiconductor layer of the aforementioned thin film diode may be rougher than the surface of the semiconductor layer of the aforementioned thin film transistor.

The aforementioned thin film transistor may be a plurality of thin film transistors including the n channel type thin film transistor and the p channel type thin film transistor.

The present invention provides a method of manufacturing a semiconductor device having a thin film transistor and a thin film diode on a same substrate includes (a) forming a non-crystalline semiconductor film on a surface of the aforementioned substrate, the aforementioned non-crystalline semiconductor film including a first non-crystalline portion positioned in a region of the surface of the aforementioned substrate in which the thin film transistor is to be formed and a second non-crystalline portion positioned in a region in which the thin film diode is to be formed and being thicker than the aforementioned first non-crystalline portion; (b) obtaining a crystalline semiconductor film including a first crystalline portion, resulting from crystallizing the aforementioned first non-crystalline portion of the aforementioned non-crystalline semiconductor film, and a second crystalline portion by crystallizing the aforementioned second non-crystalline portion and having a rougher surface than the aforementioned first crystalline portion, by radiating a laser beam to the aforementioned non-crystalline semiconductor film to crystallize it; and (c) forming a first island of semiconductor layer, which is later to become the active region of the thin film transistor, and a second island of semiconductor layer, which is later to become the active region of the thin film diode, by patterning the aforementioned crystalline semiconductor film, the aforementioned first island of semiconductor layer including the aforementioned first crystalline portion, and the aforementioned second island of semiconductor layer including the aforementioned second crystalline portion.

In a preferred embodiment, the aforementioned step (a) includes a step (a1) of forming a lower layer film made of non-crystalline semiconductor in a region of the surface of the aforementioned substrate in which the aforementioned thin film diode is to be formed; and a step (a2) of forming an upper layer film made of non-crystalline semiconductor to be in contact with the surface of the aforementioned lower layer film in the region in which the aforementioned thin film diode is to be formed and the region in which the aforementioned thin film transistor is to be formed, in order to obtain the aforementioned non-crystalline semiconductor film including the aforementioned lower layer film and the aforementioned upper layer film, the aforementioned first non-crystalline portion including the aforementioned upper layer film and not including the aforementioned lower layer film, and the aforementioned second non-crystalline portion including the aforementioned lower layer film and the aforementioned upper layer film.

The aforementioned substrate may be a substrate having optical transmissivity; and the aforementioned manufacturing method may further include in advance of the aforementioned step (a), a step of forming a light blocking layer in a portion of the aforementioned substrate which is a lower portion of the region, in which the second island of semiconductor layer, later to be the active region of the thin film diode, is to be formed, for blocking the light incoming from the surface on the opposite side of the aforementioned substrate; the aforementioned step (a1) may include: a step (a1-1) of forming a film made of non-crystalline semiconductor on the substrate on which the aforementioned light blocking layer is formed; a step (a1-2) of forming a resist layer by forming a resist film atop the aforementioned film and exposing and developing it; and a step (a1-3) of obtaining the aforementioned lower layer film by etching the aforementioned film using the aforementioned resist layer as a mask; and the aforementioned step (a1-2) may include a step for exposing the aforementioned resist film from the surface on the aforementioned opposite side of the aforementioned substrate using the aforementioned light blocking layer as a mask.

In a preferred embodiment, the aforementioned step (a) includes a step (a11) of forming a film made of a non-crystalline semiconductor on the surface of the aforementioned substrate in the region in which the aforementioned thin film diode is to be formed and the region in which the aforementioned thin film transistor is to be formed; and a step (a12) of obtaining the aforementioned non-crystalline semiconductor film by making the portion of the aforementioned film located in a region in which the aforementioned thin film transistor is to be formed thinner than the portion located in the region in which the aforementioned thin film diode is to be formed.

The aforementioned substrate may be a substrate having optical transmissivity; the aforementioned method of manufacturing may include in advance of the aforementioned step (a) a step of forming a light blocking layer on the aforementioned substrate in the portion underneath the region in which the second island of semiconductor layer later to become the active region of the thin film diode is to be formed for blocking light incoming from the surface on the opposite side of the aforementioned substrate; the aforementioned step (a12) may include: a step (a12-1) of forming a resist film on the aforementioned film and exposing and developing it to form a resist layer; and a step (a12-2) of obtaining the aforementioned non-crystalline semiconductor film by making the portion of the aforementioned film not covered by the aforementioned resist layer thinner by etching the aforementioned film using the resist layer as a mask. The aforementioned step (a12-1) may include a step of exposing the aforementioned resist film from the surface on the aforementioned opposite side of the aforementioned substrate using the aforementioned light blocking layer as a mask.

The display device of the present invention includes a display region having a plurality of display portions, a frame region being positioned in the periphery of the aforementioned display region; the aforementioned display device further includes a photo sensor portion including a thin film diode; each display portion includes an electrode and a thin film transistor connected to the aforementioned electrode; the aforementioned thin film transistor and the aforementioned thin film diode are formed on the same substrate; the aforementioned thin film transistor includes a crystalline semiconductor layer including a channel region, source region, and a drain region; a gate insulating film formed to cover the aforementioned crystalline semiconductor layer; and a gate electrode formed atop the aforementioned gate insulating film and controlling the conductivity of the aforementioned channel region; the aforementioned thin film diode includes a semiconductor layer including at least an n type region and a p type region. The semiconductor layer of the aforementioned thin film transistor and the semiconductor layer of the aforementioned thin film diode are a crystalline semiconductor layer formed by crystallizing a same non-crystalline semiconductor film; the thickness of the semiconductor layer of the aforementioned thin film diode is larger than the thickness of the semiconductor layer of the aforementioned thin film transistor; and the surface of the semiconductor layer of the aforementioned thin film diode is rougher than the surface of the semiconductor layer of the aforementioned thin film transistor.

In a preferred embodiment, the aforementioned display portion further includes a back light and a back light control circuit for adjusting the brightness of light radiating from the aforementioned back light, and the aforementioned photo sensor portion generates luminance signals based on the luminance of ambient light and provides an output to the aforementioned back light control circuit.

In a preferred embodiment, the display device includes a plurality of optical touch sensor portions respectively having the aforementioned photo sensor portion; and the aforementioned plurality of optical touch sensor portions are laid out in the aforementioned display region in correspondence, respectively, with each display portion or a set of two or more display portions Effects of the Invention According to the present invention, the semiconductor layers of the TFT and the TFD can respectively be optimized according to the required device characteristics in a semiconductor device having the TFT and the TFD formed on the same substrate. Therefore, it is possible to obtain the device characteristics respectively required of the TFT and the TFD.

The TFD of the present invention may be suitably used as a photo sensor in particular. Because the surface of the semiconductor layer for the TFD is rougher than the surface of the semiconductor layer for the TFT, the reflection of light at the surface of the semiconductor layer is suppressed, and sensitivity toward light is improved. Furthermore, because the thickness of the semiconductor layer is greater than the thickness of the semiconductor layer for the TFT, the rate of light absorption is higher, and as a result, the sensitivity toward light is further enhanced. Therefore, the optical efficiency in the photo sensor can be enhanced greatly. On the other hand, because the roughness is suppressed on the surface of the semiconductor layer of the TFT, reliability (gate breakdown voltage) is ensured. Furthermore, because the thickness of the semiconductor layer is limited, the off current is reduced. Furthermore, the subthreshold characteristics (including the threshold voltage) are improved.

Furthermore, according to the manufacturing method of the present invention, the aforementioned semiconductor device can be manufactured simply and without adding to the manufacturing steps or the manufacturing cost and a smaller form factor, higher performance, and lower cost are achieved with the product.

DETAILED DESCRIPTION OF EMBODIMENTS

Figure 1:
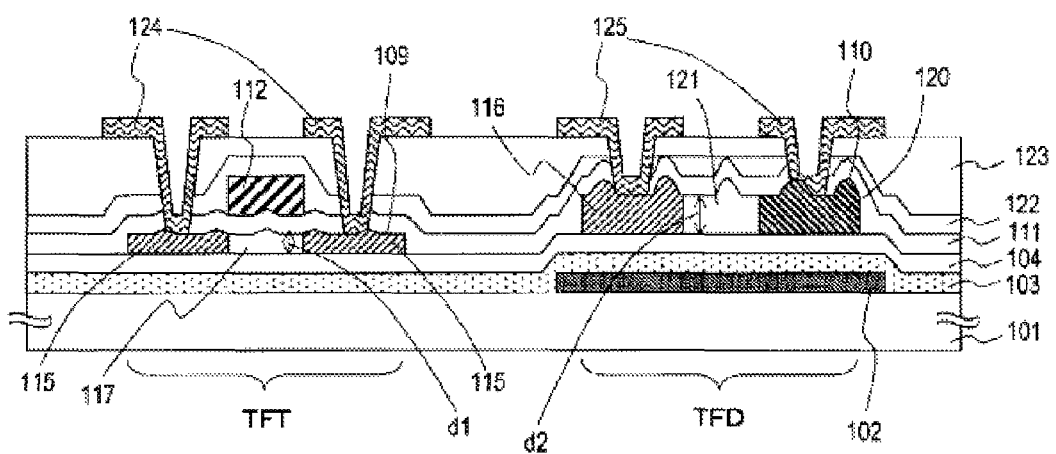
FIG. 1 is a cross-sectional schematic of a semiconductor device of the first preferred embodiment according to the present invention.

In order to optimize the respective device characteristics of the TFT and TFD formed on the same substrate, the present inventors have investigated the various aspects of the relationships between the semiconductor layer structures and device characteristics of the TFT and TFD. As a result, it has been discovered that the device characteristics required of the respective devices can both be realized by controlling the roughness of the semiconductor layer in the TFT and TFD, regardless of the crystal states of the semiconductor layers.

Specifically, by increasing the surface roughness of the semiconductor layer in the TFD (photo sensor TFD used as a photo sensor), it is possible to suppress the reflection of light incident onto the semiconductor layer and increase the photo current. As a result, sensitivity to the ambient light, or the SN ratio (ratio of photo current to noise current) is enhanced with respect to light. On the other hand, a rougher surface on the semiconductor layer in the TFT leads to lower reliability (particularly with the gate breakdown voltage). Therefore, surface roughness on the semiconductor layer should preferably be reduced.

On the other hand, it is possible to enhance the photo absorption rate in the semiconductor layer by making the TFD semiconductor layer thicker. Therefore, making the semiconductor layer thicker and its surface rougher in the TFD both contribute to effectively improving the SN ratio.

The present invention has been made based on the discovery described above and is characterized by the surface of the semiconductor layer in the TFD being rougher than the surface of the semiconductor layer in the TFT, and by the semiconductor layer in the TFD being thicker than the semiconductor layer in the TFT. As a result, increased photo current in the TFD makes it possible to use the light more efficiently, and a higher reliability is ensured with the TFT.

The present inventors have also discovered that, when the surface of the semiconductor layer in the TFD is made rougher than the surface of the semiconductor layer in the TFT by taking advantage of the surface roughness resulting from the crystallization of a non-crystalline semiconductor film, the manufacturing process can be significantly simplified. A detailed description will be provided below.

The aforementioned surface roughness is created when, after the semiconductor film first melts under laser beam irradiation, crystal nuclei form, the solid phase grows from these crystal nuclei, ridges form at the crystal grain boundaries at places where the transformation into the solid phase last takes place, and peaks form where three or more crystal grain boundaries meet (multi points). These ridges and peaks are formed as a result of the difference in volume between the melted state and the solid state. In the present specification, the aforementioned ridges and peak portions on the surface of the semiconductor film are referred to as "ridges."

It has been believed that the presence of such ridges on the semiconductor layer surface (channel interface) in the conventional TFT would cause inferior interface characteristics, lower field effect mobility, and a concentration of electrical fields at the tips of the ridges, which reduce the gate insulating film breakdown voltage and the reliability. For this reason, reducing the ridges has been considered an important issue, and various efforts have been made for reducing these ridges.

The present inventors, on the other hand, have explored the process for enhancing the TFD characteristics by taking advantage of these ridges. As a result, the inventors have discovered that the size of the ridges formed on the semiconductor film surface can be controlled with the semiconductor film thicknesses. Because the ridges are caused by the volume difference between the melted state and the solid state in the semiconductor film, a larger volume (film thickness) of the overall semiconductor film is thought to lead to larger ridges.

For this reason, a manufacturing method of the present invention is characterized by the formation of a non-crystalline semiconductor film having partially varied thicknesses and the formation of crystalline semiconductor films having partially varied surface roughness by taking advantage of this difference in thicknesses for the crystallization step. As a result, a TFT semiconductor layer and a TFD semiconductor layer, which is thicker and has a rougher surface than the TFT semiconductor layer, can be formed from the same non-crystalline semiconductor film. Consequently, it is not necessary to add to the manufacturing process steps or make the manufacturing process more complex in order to achieve varying surface roughness on the semiconductor layers. Furthermore, a simpler process can be used, because there is no need to separately control the crystal states in each of the semiconductor layers, as in the methods described in Patent Documents 2 and 3.

Specifically, the semiconductor layers in the TFT and TFD can be formed using the method described next.

First, a non-crystalline semiconductor film having partially different thicknesses is formed by depositing a film of non-crystalline semiconductor in two steps on a substrate. Specifically, a lower layer, constructed of non-crystalline semiconductor, is formed in a region in which the TFD is to be formed on the substrate surface in the first film deposition step. Then, an upper layer film is formed in the second film deposition step in regions in which the TFT and TFD are to be formed on the substrate surface. A non-crystalline semiconductor film, made of the lower layer film and the upper layer film, is thus obtained. The resulting non-crystalline semiconductor film is thicker by an amount comparable to the thickness of the lower layer film in the region in which the TFD is to be formed, as compared with the region in which the TFT is to be formed.

Next, the non-crystalline semiconductor film is crystallized into a crystalline semiconductor film by irradiation with a laser beam on the non-crystalline semiconductor film from above the substrate. As mentioned earlier, larger ridges are formed on the surface during crystallization, when the non-crystalline semiconductor film is thicker. For this reason, the resulting crystalline semiconductor film has a rougher surface at the thicker portion compared with the thinner portion.

Then, the TFT semiconductor layer is formed using the portion of the crystalline semiconductor film that is thinner and having less rough surface, and the TFD semiconductor layer is formed using the portion that is thicker and having rougher surface.

In the aforementioned method, a light blocking layer may be formed in the region in which the TFD is to be formed before the non-crystalline semiconductor film is deposited. In such an instance, a patterning of the lower layer film in the first film deposition step can be achieved in a self-aligned manner with an exposure from the back side of the substrate with the light blocking layer used as a mask. As a result, a photo mask can be eliminated.

Furthermore, while the non-crystalline semiconductor film having partially varied thicknesses is formed using two film deposition steps in the aforementioned method, in the alternative, a film made of non-crystalline semiconductor may be deposited on the substrate, followed by half etching.

With the aforementioned method described in Patent Document 3, laser irradiation is performed on the non-crystalline semiconductor film, which has been made thinner in some portions. With this method, the radiation conditions (radiation energy, etc.) and the thickness of the semiconductor film are selected in such a way that the film is crystallized only in the portion that is thinner, and the portion that has not been made thinner remains non-crystalline. In such an instance, ridges do no form on the surface of the portion that remains non-crystalline, and its surface roughness would be extremely small, as compared with the surface of the portion that has been crystallized. With the aforementioned method, on the other hand, the laser irradiation conditions are set for crystallizing both the thick portion and the thin portion of the non-crystalline semiconductor film. The resulting crystalline semiconductor film has ridges across its entire surface in proportion to the film thickness.

In the present specification, the "surface roughness" can encompass the arithmetic average roughness Ra or the maximum height Rz, as specified in the JIS B 0601-2001 specification. Therefore, at least the arithmetic average roughness Ra of the TFD semiconductor layer should be larger than the arithmetic average roughness Ra of the TFT semiconductor layer, or the maximum height Rz of the TFD semiconductor layer should be larger than the maximum height Rz of the TFT semiconductor layer. As a result, optical reflection at the surface of the TFD semiconductor layer can be made less than at the surface of the TFT semiconductor layer.

More specifically, the maximum height Rz is determined by the height of the highest ridges, regardless of the number of ridges (density) on the surface in the present preferred embodiment. On the other hand, the arithmetic average roughness Ra is greater for a higher ridge density, even when the ridges have low heights. Here, given the same semiconductor film thickness, a smaller ridge density (larger crystal grain diameters) tends to result in taller ridges, because of the ridge growth mechanism involved. The ridge heights, therefore, can vary with the crystal grain diameters and not just with the semiconductor film volume (thickness).

The higher the individual ridges formed on the semiconductor layer surface here, the more effective these ridges are in suppressing the optical reflection, and the photo sensor TFD characteristics are improved. Therefore, the effects described above can be achieved, as long as the maximum height Rz of the TFD semiconductor layer surface is greater than the maximum height Rz of the TFT semiconductor layer surface, regardless of the magnitude of the arithmetic average roughness Ra.

Furthermore, the higher the density of the ridges formed on the semiconductor layer surface—i.e., the larger the arithmetic average roughness Ra, the more effective is the suppression of optical reflection. Therefore, the aforementioned effects can be achieved as long as the arithmetic average roughness Ra of the TFD semiconductor layer surface is greater than the arithmetic average roughness Ra of the TFT semiconductor layer surface, regardless of the size of the maximum height Rz.

The arithmetic average roughness Ra of the TFD semiconductor layer surface may preferably be larger than the arithmetic average roughness Ra of the TFT semiconductor layer surface, and in addition, the maximum height Rz of the TFD semiconductor layer preferably may preferably be larger than the maximum height Rz of the TFT semiconductor layer surface. This is because the optical reflection can be suppressed more reliably, and the TFT reliability can be ensured, while the TFD SN ratio is improved.

First Preferred Embodiment

A semiconductor device according to a first preferred embodiment of the present invention will be described next with reference to the figures. The semiconductor device of the present preferred embodiment includes an n channel TFT and a TFD formed on an identical substrate and is used, for example, as an active matrix type display device having a sensor portion.

FIG. 1 is a cross-sectional schematic of an example of the semiconductor device of the present preferred embodiment. The semiconductor device of the present preferred embodiment typically includes a plurality of TFTs and a plurality of TFDs formed on the same substrate, but the structure shown in the figure only includes a single TFT and a single TFD for the sake of simplicity. While the example of the TFT shown is an n channel TFT having a single drain structure, the structure of the TFT is not limited to such. For example, the structure may include a TFT of the LDD structure or the GOLD structure, or may include a plurality of TFTs, including an n channel TFT and a p channel TFT.

The semiconductor device of the present preferred embodiment includes a TFT and a TFD formed on a substrate 101 through underlying films 103 and 104 therebetween. The TFT includes a semiconductor layer 109 including a channel region 117 and a source region and drain region 115, a gate insulating film 111 formed on the semiconductor layer 109, a gate electrode 112 controlling the conductivity of the channel region 117, and electrodes and wiring 124 connected respectively to the source region and drain region 115. The TFD includes a semiconductor layer 110, including at least an n type region 116 and a p type region 120, and electrodes and wirings 125, connected respectively to the n type region 116 and the p type region 120. In the example shown in the figure, an intrinsic region 121 is formed between the n type region 116 and p type region 120 in the semiconductor layer 110.

A silicon nitride film 122 and a silicon oxide film 123 are formed over the TFT and the TFD as interlayer insulating films. Furthermore, when a transparent substrate is used as the substrate 101, a light blocking film 102 may be formed between the semiconductor layer 110 of the TFD and the substrate 101 in order to prevent any light from radiating from the back side of the substrate 101 into the semiconductor layer 110.

The semiconductor layer 109 of the TFT and the semiconductor layer 110 of the TFD are crystalline semiconductor layers formed by crystallizing an identical non-crystalline semiconductor film. Thickness d2 of the semiconductor layer 110 of the TFD is larger than the thickness d1 of the semiconductor layer 109 of the TFT. Furthermore, the surface of the semiconductor layer 110 of the TFD is rougher than the surface of the semiconductor layer 109 of the TFT.

Ridges are formed on the surfaces of the semiconductor layers 109 and 110. When the non-crystalline semiconductor film is irradiated with a laser beam and becomes crystallized, the ridges are formed as the non-crystalline semiconductor film melts and solidifies. The ridges are typically present over the boundaries of crystal grains included in the semiconductor layers 109 and 110. In the present preferred embodiment, the average height of the ridges formed on the surface of the semiconductor layer 110 of the TFD is greater than the average height of the ridges formed on the surface of the semiconductor layer 109 of the TFT, and as a result, the surface of the semiconductor layer 110 is rougher than the surface of the semiconductor layer 109.

The semiconductor device of the present preferred embodiment offers the following advantages.

Because the thickness d2 of the semiconductor layer 110 of the TFD (particularly the photo sensor TFD) is greater than the thickness d1 of the semiconductor layer 109 of the TFT in the present preferred embodiment, the semiconductor layer 110 of the TFD offers a higher optical absorption rate and enhances the TFD sensitivity. Furthermore, because the surface of the semiconductor layer 110 is rougher than the surface of the semiconductor layer 109 of the TFT, reflection of incident light at the surface of the semiconductor layer 110 is suppressed by the rough surface, and sensitivity to light is further enhanced. Therefore, these effects in combination contribute to increased photo current under a radiation of light, and to an improvement in the ratio of photo current to the noise current, which is the SN ratio.

On the other hand, because the thickness d1 of the semiconductor layer 109 of the TFT in the present preferred embodiment is small, the off current is lower, and the switching characteristics (on/off current ratio) is improved. Furthermore, when the TFT is turned on, a complete depletion is achieved more rapidly, and the subthreshold characteristics, including the threshold voltage, are improved. Furthermore, because the roughness on the surface of the semiconductor layer 109 is reduced, the breakdown characteristics and the reliability against gate bias stress of the gate insulating film 111 is improved, and the field effect mobility is improved.

As thus shown, the respective device characteristics are optimized in accordance with their respective requirements by achieving different thicknesses and levels of surface roughness without significantly varying the crystal properties between the semiconductor layer 109 of the TFT and the semiconductor layer 110 of the TFD in the present preferred embodiment.

When the semiconductor layer 110 of the TFD includes the intrinsic region 121 here, the same effects as the aforementioned can be achieved as long as the surface of at least the intrinsic region 121 of the semiconductor layer 110 of the TFD is rougher than the surface of the semiconductor layer 109 of the TFT (particularly the surface of the channel region 117).

In the present preferred embodiment, the difference Δd between the thickness d1 of the semiconductor layer 109 of the TFT and the thickness d1 of the semiconductor layer 110 of the TFD preferably is 5 nm or greater and 25 nm or less. When the thickness difference Δd is less than 5 nm, it is difficult to make the surface roughness different enough between the semiconductor layers 109 and 110 during the laser crystallization process, and it may become difficult to attain the device characteristics of both the TFT and TFD. On the other hand, when the thickness d2 is too large compared with the thickness d1 (for example, the difference Δd exceeding 25 nm), the thick portion in the non-crystalline semiconductor film (the portion to become the TFD active region) may not be adequately crystallized in the same laser crystallization process, and its surface may in fact become less rough. This is because the ridges may not be formed or only relatively small ridges may be formed.

While there are no particular limitations on the thicknesses d1 and d2 of the semiconductor layers 109 and 110 of the TFT and TFD, the thickness difference Δd preferably is selected to be within the aforementioned range. In this example, the thickness d1 of the semiconductor layer 109 is set at 30 nm or above and 50 nm or below, and the thickness d2 of the semiconductor layer 110 is set at 35 nm or above and 75 nm or below.

Although no particular limitations are imposed on the surface roughness of the semiconductor layers 109 and 110, the arithmetic average roughness Ra of the surface of the semiconductor layer 109 preferably is 4 nm or greater and 6 nm or less, and the arithmetic average roughness Ra of the surface of the semiconductor layer 110 preferably is 6 nm or greater and 9 nm or less, when the thickness of the semiconductor layer 109 of the TFT is 40 nm, and the thickness of the semiconductor layer 110 of the TFD is 60 nm. Furthermore, the maximum height Rz on the surface of the semiconductor layer 109 preferably is 30 nm or greater and 50 nm or less, and the maximum height Rz on the surface of the semiconductor layer 110 preferably is 60 nm or greater and 90 nm or less. When the levels of surface roughness of the semiconductor layers 109 and 110 fall within the aforementioned ranges, the TFD photo detection sensitivity (photo current value) is approximately 1.8 times as much as the photosensitivity of a TFD formed using a semiconductor layer having a surface roughness comparable to the TFT (Ra: 4-6 nm).

An example of a method of manufacturing the semiconductor device of the present preferred embodiment will be described below with reference to the figures.

Figure 2:
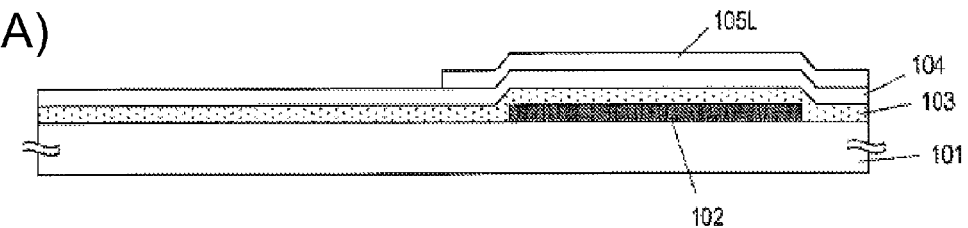
FIG. 2(A) through FIG. 2(E) are cross-sectional schematics of a manufacturing process for the semiconductor device of the first preferred embodiment of the present invention.
Figure 2:
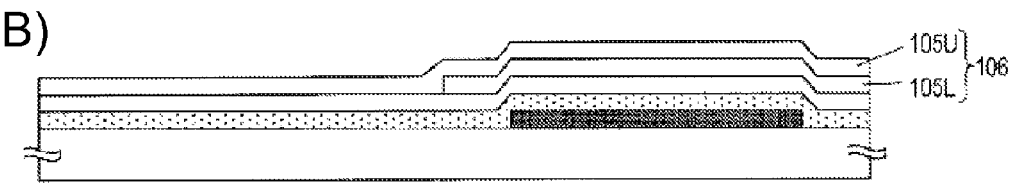
Figure 2:
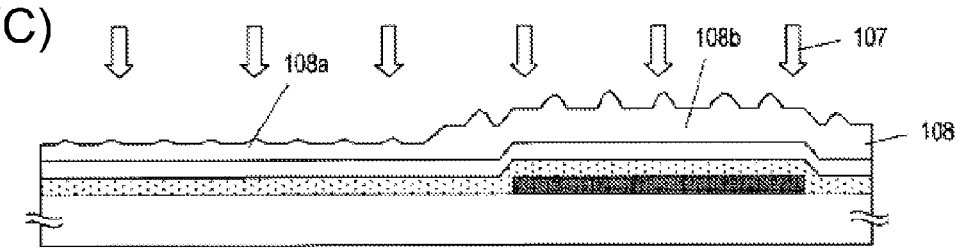
Figure 2:
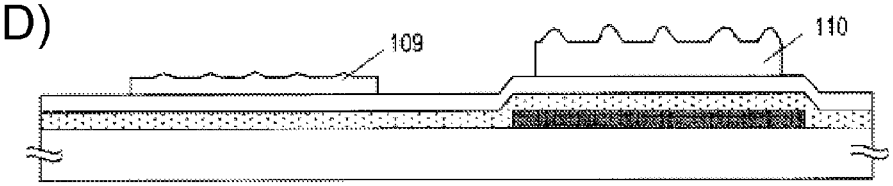
Figure 2:
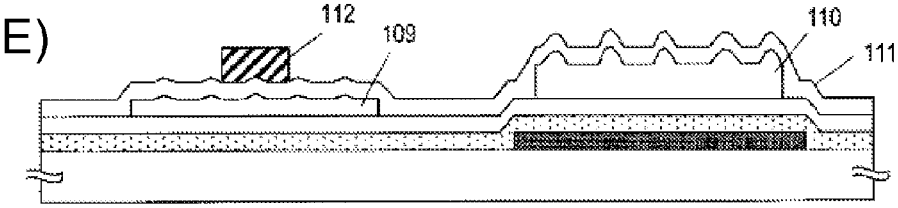

First, as shown in FIG. 2(A), a light blocking layer 102 is formed on the substrate 101, and a silicon nitride film 103 and a silicon oxide film 104 are formed next as the underlying films. Then a lower layer film 105L, made of a non-crystalline semiconductor film (here a non-crystalline silicon film), is formed at a portion of the substrate 101.

A low alkali glass substrate or a quartz substrate may be used as the substrate 101. The low alkali glass substrate is used in the present preferred embodiment. In this case, the substrate may be thermally treated in advance at a temperature that is 10 to 20° C. lower than the glass strain point.

The light blocking layer 102 is placed in such a way as to block the light from the direction of the back face of the substrate to the TFD. The material used for the light blocking layer 102 may be a metal film or a silicon film. When a metal film is used, a high melting point metal like tantalite (Ta), tungsten (W), or molybdenum (Mo) should be chosen in consideration of the thermal treatments to follow in the subsequent manufacturing steps. In the present preferred embodiment, a molybdenum film is deposited by sputtering and then patterned to form the light blocking layer 102. The thickness of the light blocking layer 102 should be 20 to 200 nm and preferably 30 to 150 nm. It is, for example, set at 100 nm in the present preferred embodiment.

The silicon nitride film 103 and the silicon oxide film 104 are formed to prevent impurity diffusion from the substrate 101. In the present preferred embodiment, the underlying films 103 and 104 are formed by plasma CVD methods. The total thickness of these underlying films 103 and 104 is 100 to 600 nm or preferably 150 to 450 nm. While a two-layer underlying film is used in the present preferred embodiment, a single layer of, for example, silicon oxide film, also works.

The lower layer film 105L, made of non-crystalline silicon, is formed by depositing a non-crystalline silicon film using a well-known method, such as plasma CVD or sputtering, and then by patterning it. The lower layer film 105L is formed in the region in which the TFD is to be formed on the substrate 101. The thickness of the lower layer film 105L is 5 nm or greater and 25 nm or less and is, for example, 20 nm.

Next, as shown in FIG. 2(B), an upper layer film 105U, made of non-crystalline silicon, is formed by, for example, a plasma CVD method. In the present preferred embodiment, the upper layer film 105U is formed in the region in which the TFD and the TFT are to be formed on the substrate 101 and is formed in such a way as to be in contact with the top surface of the lower layer film 105L. The thickness of the upper layer film 105U is, for example, set at 40 nm.

A non-crystalline silicon film 106 including the lower layer film 105L and the upper layer film 105U is thus obtained. The thickness of the non-crystalline silicon film 106 is thicker in the region in which the TFD is to be formed compared with the region in which the TFT is to be formed by an amount corresponding to the thickness of the lower layer film 105L. In the present preferred embodiment, the thickness of the non-crystalline silicon film 106 is 60 nm at the thick portion (total thickness of the lower layer film 105L and the upper layer film 105U) and is 40 nm in the thin portion (thickness of only the upper layer film 105U).

Next, as shown in FIG. 2(C), a laser beam 107 is irradiated on the non-crystalline silicon film 106 from above the substrate 101 to crystallize the non-crystalline silicon film 106 and obtain a crystalline silicon film 108. In the present preferred embodiment, an XeCl excimer laser beam of 308 nm in wavelength is used as the laser beam 107. The beam size of the laser beam 107 is formed to exhibit an elongated shape at the surface of the substrate 101, and the entire substrate surface is crystallized through progressive scanning in a direction perpendicular to the elongated direction. Here the scanning preferably is conducted in such a way that portions of the beams overlap. As a result, any one point on the non-crystalline silicon film 106 is exposed to multiple laser irradiation, and the uniformity of the crystal state is improved.

With the irradiation of the laser beam 107, the non-crystalline silicon film 106 is melted instantaneously and crystallizes during the process of solidification and turns into the crystalline silicon film 108. Ridges are created on the surface of the crystalline silicon film 108 during the melting and solidification process due to a difference in volume between the melted state and the solid state. Here, the larger the volume (thickness) of the non-crystalline silicon film 106, the larger the individual ridges. Therefore, as shown in the figure, the surface of the crystallized portion 108b, where the thicker portion of the non-crystalline silicon film 106 has been crystallized, is rougher than the surface of the crystallized portion 108a, where the thinner portion has been crystallized.

Next, as shown in FIG. 2(D), extraneous regions of the crystalline silicon film 108 are removed in order to isolate the devices. As a result, the semiconductor layer 109, which is later to become the active regions (source/drain regions and channel region) of the TFT, is formed using the crystalline portion 108a of the crystalline silicon film 108, and the semiconductor layer 110, which is later to become the TFD active regions (n+ type/p+ type regions and intrinsic region), is formed using the crystalline portion 108b.

Next, as shown in FIG. 2(E), a gate insulating film 111 covering these islands of semiconductor layers 109 and 110 is deposited, followed by the formation of a gate electrode 112, which is for the TFT formed later, over the gate insulating film 111.

The gate insulating film 111 preferably is a silicon oxide film having a thickness of 20 to 150 nm and is here a silicon oxide film of 100 nm.

The gate electrode 112 is formed by depositing a conductive film on the gate insulating film 111 using, for example, a sputtering method or CVD method and is formed by patterning the film. The conductive film may be one of the refractory metals like W, Ta, Ti, or Mo, or its alloy. Furthermore, the thickness of the conductive film preferably is 300 to 600 nm. In the present embodiment, tantalite with a small amount of nitride additive is used (450 nm in thickness).

Figure 3:
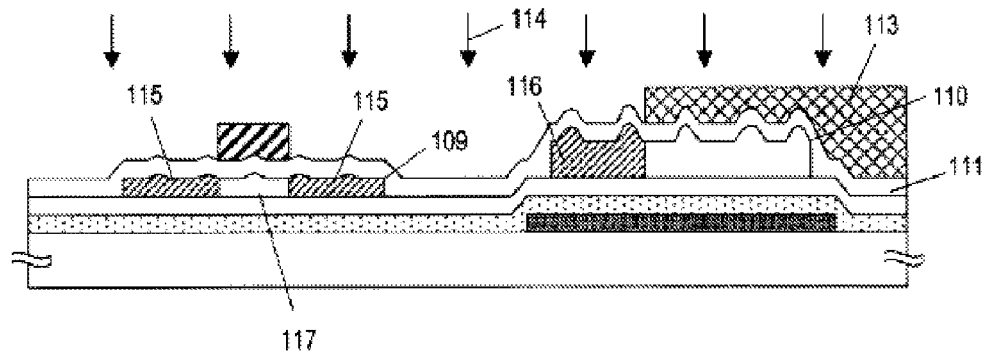
FIG. 3(F) through FIG. 3(H) are cross-sectional schematics of a manufacturing flow for the semiconductor device of the first preferred embodiment of the present invention.
Figure 3:
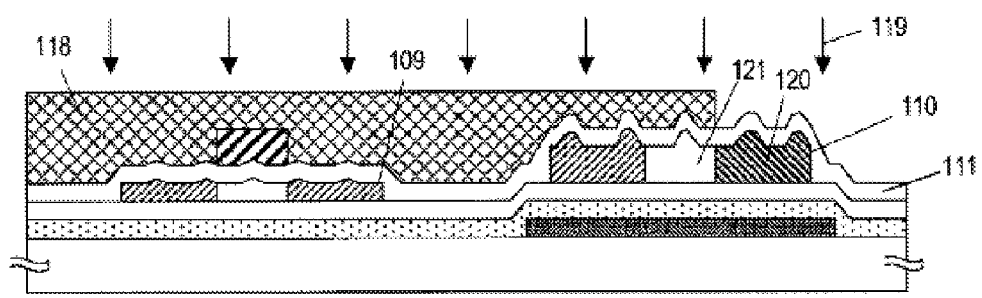
Figure 3:
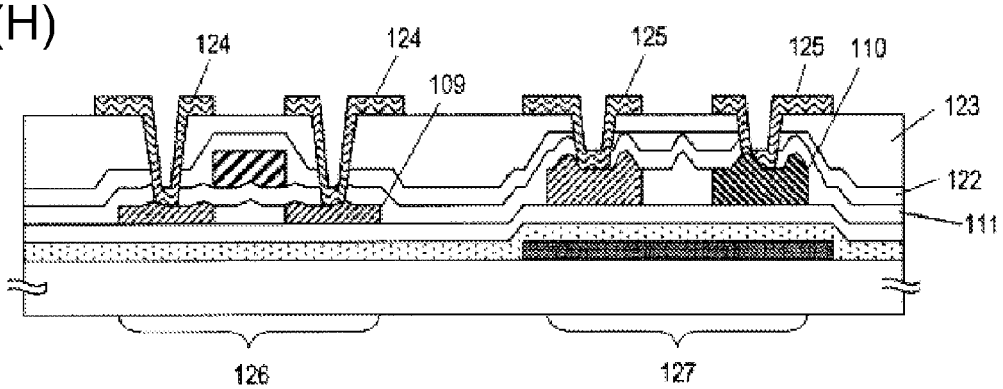

Next, as shown in FIG. 3(F), a mask 113 made of a resist is formed over the gate insulating film 111 in such a way as to cover a portion of the semiconductor layer 110 which is later to become the TFD active region. Then, in this state, an n type impurity (phosphorous) 114 is ion doped across the entire surface from above the substrate 101. The phosphorous 114 is implanted through the gate insulating film 111 into the semiconductor layers 109 and 110. As a result of this step, the phosphorous 114 is implanted into the semiconductor layer 110 of the TFD in the region not covered by the resist mask 113 and into the semiconductor layer 109 of the TFT in the region not covered by the gate electrode 112. The phosphorous 114 is not doped into the regions covered by the resist mask 113 or by the gate electrode 112. As a result, in the semiconductor layer 109 of the TFT, the region where the phosphorous 114 is implanted will become the source region and drain region 115 of the TFT later, while the region masked by the gate electrode 112 and not implanted with phosphorous 114 will become the channel region 117 of the TFT later. Furthermore, in the semiconductor layer 110 of the TFD, the region implanted with the phosphorous 114 will become the n+ region 116 of the TFD later.

After the resist mask 113 is stripped off, as shown in FIG. 3(G), a mask 118 made of a resist is formed over the gate insulating film 111 in such a way as to cover a portion of the semiconductor layer 110, which is later to become the active region of the TFD, and the entire semiconductor layer 109, which is later to become the active region of the TFT. In this state, a p-type impurity (boron) 119 is ion doped across the entire surface from above the substrate 101. Here, ion doping of the boron 119 is accomplished by implanting into the semiconductor layer 110 through the gate insulating film 111. As a result of this step, in the semiconductor layer 110 of the TFD, the region not covered by the resist mask 118 is implanted with the boron 119 and will become the p+-type region 120 of the TFD later. Also, the region not implanted by either boron or phosphorous in the semiconductor layer 110 of the TFD later becomes the intrinsic region 121.

After the resist mask 118 is stripped off, an annealing treatment is conducted in an inert atmosphere of, for example, a nitrogen atmosphere. As a result of this anneal treatment, doping damages, such as crystal defects, created during doping are removed in the source drain regions 115 of the TFT and the n+ type region 116 and the p+ type region 120 of the TFD, and phosphorous and boron, doped in respective regions, are activated. This anneal treatment may be conducted using an anneal furnace in wide use, but preferably is conducted by RTA (rapid thermal annealing). A type in which a high temperature inert gas is blown on the substrate surface to achieve instantaneous temperature rise and drop is particularly suited.

Next, as shown in FIG. 3(H), the silicon nitride film 122 and the silicon oxide film 123 are formed in the order mentioned as the interlayer insulating films. A thermal treatment for hydrogenating the semiconductor layers 109 and 110 may be conducted as needed by, for example, annealing in a nitrogen atmosphere or in an atmosphere with hydrogen mixed in at 1 atm at 350 to 450° C. Then, contact holes are formed in the interlayer insulating films 122 and 123. Next, a film made of a metal material (for example, a double layer film of TiN and Aluminum) is deposited inside the contact holes and over the insulating film 123, and the electrodes and wiring lines 124 of the TFT and the electrodes and wiring lines 125 of the TFD are formed by patterning it. The thin film transistor 126 and the thin film diode 127 are thus obtained. Here, a protective film made of, for example, a silicon nitride film may be formed atop the thin film transistor 126 and the thin film diode 127 for the purpose of their protection.

According to the aforementioned method, it is possible to distinctly create the semiconductor layers 109 and 110 having different levels of surface roughness by taking advantage of the difference in the thicknesses of the non-crystalline silicon film 106. As a result, it is possible to form the semiconductor layers 109 and 110 having different thicknesses and levels of surface roughness without making the manufacturing process complex.

Furthermore, according to the aforementioned method, the thickness of the non-crystalline silicon film 106 is made partially different through a double layer structure. As a result, there is an advantage in that the thickness of the thin portion of the non-crystalline semiconductor film 106 (the portion later to be the active region of the TFT) is easier to control, compared with a preferred embodiment to be described later, in which the thickness is changed by making the film partially thinner.

In the aforementioned method, when the irradiation energy of the laser beam 107 on the non-crystalline silicon film 106 is set at an optimal level for the thick portion of the non-crystalline silicon film 106, micro crystals form in the thin portion due to excess power, and the TFT characteristics may degrade significantly. Therefore, the energy of irradiation should preferably be optimized for the thin portion of the non-crystalline silicon film 106 (the portion later to become the active region of the TFT). As a result, the thin portion of the non-crystalline silicon film 106 becomes crystallized and becomes a crystalline portion 108a having crystal properties that are highly desirable. In this instance, not enough power would be directed at the thick portion of the non-crystalline silicon film 106 (the portion later to become the active region of the TFD), which turns into a crystalline portion 108b having inferior crystal properties compared with the crystalline portion 108a. Nevertheless, the slightly inferior crystal properties in the active region of the photo sensor TFD, in comparison to the crystal properties of the active region for the TFT, does not have a significant impact on the performance, such as the detector sensitivity. Therefore, it is possible to achieve the device characteristics for both the TFD and TFT.

Furthermore, setting the irradiation energy at an optimal level for the thin portion of the non-crystalline silicon film 106 (the portion later to become the active region of the TFT) offers the advantages described next.

A semiconductor film that has been crystallized with inadequate power in general tends to have inferior crystal properties and a smaller average crystal grain diameter. Because ridges form over the crystal grain boundaries, the ridge density increases with smaller crystal grain diameters. Therefore, as described above, when the laser beam is irradiated on the portion of the non-crystalline silicon film 106, that is to be the active region of the TFD, at a lower power, the ridges form on the surface of the active region of the TFD at a higher density. Furthermore, each ridge becomes taller than the ridges formed on the surface of the active region of the TFT. In general, ridges would be smaller when the crystal property is inferior, but it is possible to form taller ridges compared with the ridges formed on the surface of the active region of the TFT in the present preferred embodiment by taking advantage of the difference in the film thicknesses. As a result, the surface of the active region of the TFD becomes much rougher, and the reflection of incident light is suppressed more effectively.

Second Preferred Embodiment

A second preferred embodiment of the semiconductor device of the present invention will be described next with reference to the figures. The semiconductor device of the present preferred embodiment has a similar structure to the semiconductor device of the first preferred embodiment (FIG. 1). However, it differs from the first preferred embodiment in that the light blocking layer patterns are used for simplifying the manufacturing process.

Figure 4:
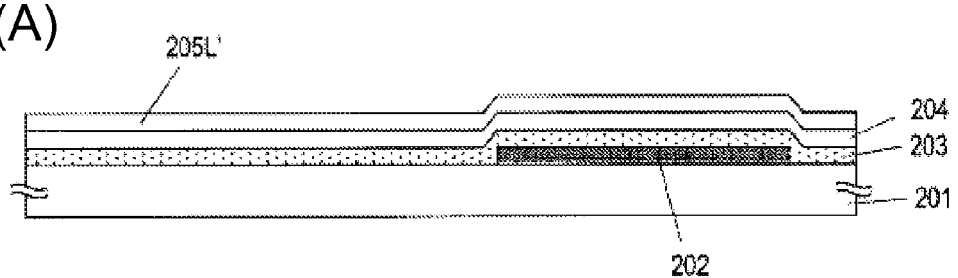
FIG. 4(A) through FIG. 4(D) are cross-sectional schematics of a manufacturing process for a semiconductor device of a second preferred embodiment of the present invention.
Figure 4:
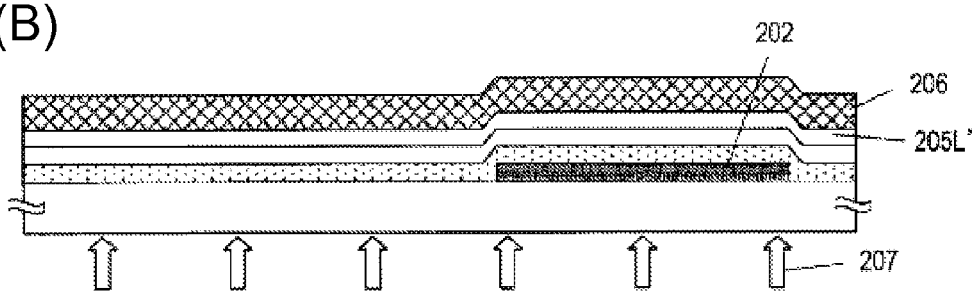
Figure 4:
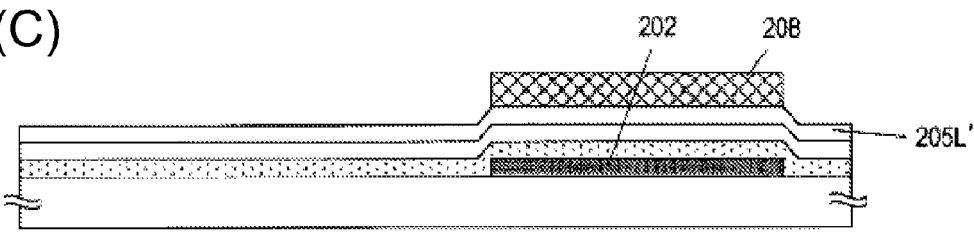
Figure 4:
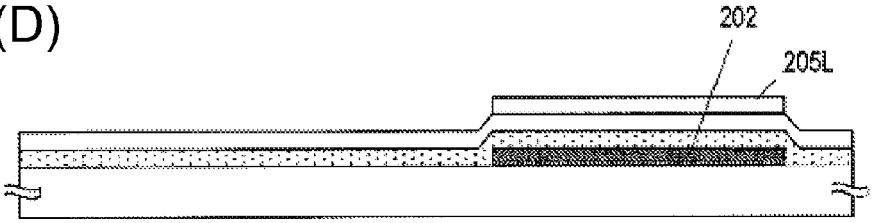

First, as shown in FIG. 4(A), a light blocking layer 202 is formed into patterns on the substrate 201, and a silicon nitride film 203 and a silicon oxide film 204 are formed as underlying films. Next, a film 205L', made of non-crystalline silicon, is formed. The method of formation is similar to the method described earlier with reference to FIG. 2(A). Furthermore, the thickness of the film 205L' is, for example, 15 nm.

Next, as shown in FIG. 4(B), a photo resist 206 is coated atop the film 205L'. Then an exposure 207 is conducted on the photo resist 206 from the back face side of the substrate 201. Here, the portion of the photo resist 206 that overlaps the light blocking layer 202 is not exposed.

After the exposure, the photo resist 206 is developed, and a resist mask 208 having identical patterns as the light blocking layer 202 is obtained as shown in FIG. 4(C).

Next, as shown in FIG. 4(D), the resist mask 208 is used for patterning the film 205L', and an island of lower layer film 205L having identical patterns as the light blocking layer 202 is obtained. Then, the resist mask 208 is stripped off.

Figure 5:
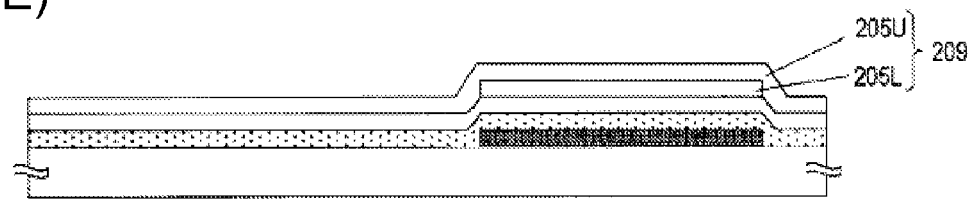
FIG. 5(E) through FIG. 5(G) are cross-sectional schematics of a manufacturing process for a semiconductor device of the second preferred embodiment of the present invention.
Figure 5:
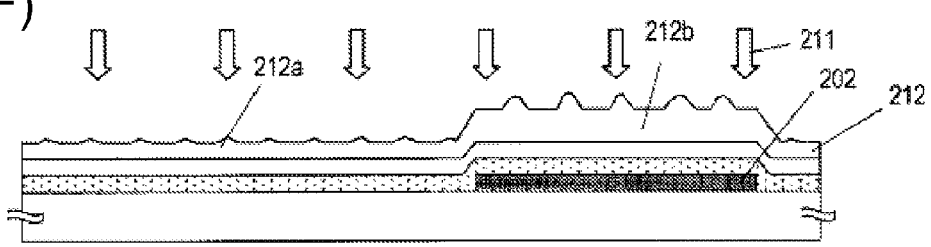
Figure 5:
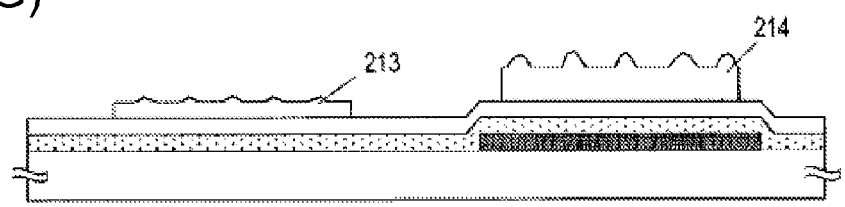

Next, as shown in FIG. 5(E), an upper layer film 205U made of non-crystalline silicon is formed across the entire substrate 201 in such a way as to cover the lower layer film 205L. The thickness of the upper layer film 205U is, for example, 35 nm. As a result, a non-crystalline silicon film 209, made of the lower layer film 205L and the upper layer film 205U, is obtained. The non-crystalline silicon film 209 is thicker in the region in which the TFD is to be formed compared with the region in which the TFT is to be formed by an amount corresponding to the thickness of the lower layer film 205L. In the present preferred embodiment, the thickness of the thick portion of the non-crystalline silicon film 209 is 50 nm (total thickness of the lower layer film 205L and the upper layer film 205U), and the thickness of the thin portion is 35 nm (thickness only of the upper layer film 205U).

Next, as shown in FIG. 5(F), the non-crystalline silicon film 209 is irradiated with a laser beam 211 from above. Here, the XeCl excimer laser light of 308 nm in wavelength is used as the laser beam 211. Furthermore, the beam size of the laser beam 211 is formed in such a way as to have an elongated shape at the surface of the substrate 201, and progressive scanning is conducted in a direction orthogonal to the elongated direction to crystallize the entire substrate surface. As a result, the non-crystalline silicon film 209 is crystallized, and a crystalline silicon film 212 is obtained. Similar to the aforementioned first preferred embodiment, the surface of a crystalline portion 212b, which results from crystallizing the thick portion of the non-crystalline silicon film 206, is rougher than the surface of a crystalline portion 212a, which results from crystallizing the thin portion, in the present preferred embodiment.

Then, as shown in FIG. 5(G), a semiconductor layer 213, which is later to become the active region of the TFT, is formed using the crystalline portion 212a, which is the portion of the crystalline silicon film 212 which is thinner and has a surface which is less rough. The crystalline portion 212b, which is thicker and has a rougher surface, is used for forming the semiconductor layer 214, which is later to become the active region of the TFD.

Although not shown in the drawings, the TFT and TFD are created later using semiconductor layers 213 and 214, respectively, using a method similar to the method described earlier with reference to FIG. 2(E) through FIG. 3(H) in the first preferred embodiment.

The effects similar to the first preferred embodiment are obtained with the present preferred embodiment. Furthermore, because the film 205L' made of the non-crystalline silicon is patterned by a back side exposure by taking advantage of the patterns of the light blocking layer 202, the manufacturing process is shortened compared with the method described earlier with reference to FIG. 2 through FIG. 3. Specifically, the number of photo masks used is reduced by one, compared with the method of the first preferred embodiment. Therefore, the effects of the present invention can be achieved without making the manufacturing process significantly longer compared with the conventional process.

Third Preferred Embodiment

A third preferred embodiment of the present invention will be described next. The semiconductor device of the present preferred embodiment has a structure similar to the semiconductor device (FIG. 1) of the first preferred embodiment. However, it differs from the manufacturing method of the first preferred embodiment in that the thickness of the non-crystalline silicon film is partially changed by making only a portion of the non-crystalline silicon film thinner.

Figure 6:
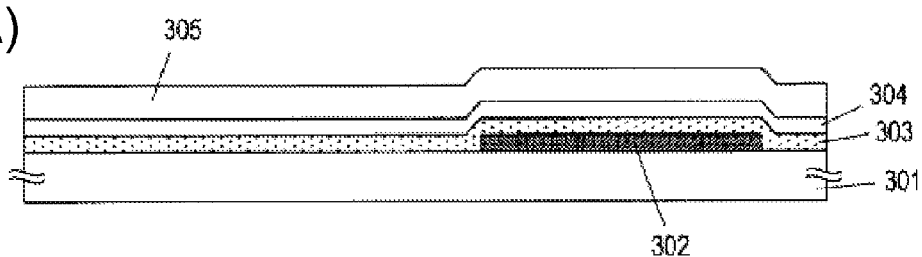
FIG. 6(A) through FIG. 6(E) are cross-sectional schematics of a manufacturing process for a semiconductor device of a third preferred embodiment of the present invention.
Figure 6:
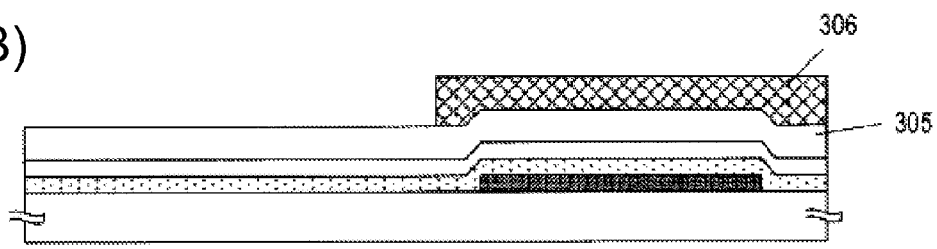
Figure 6:
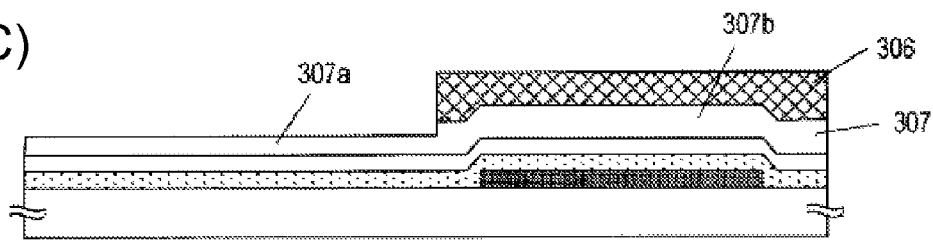
Figure 6:
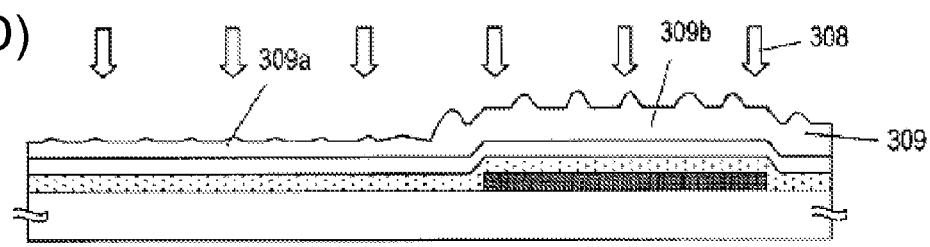
Figure 6:
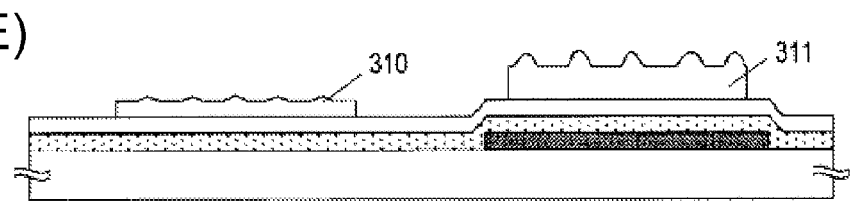

First, as shown in FIG. 6(A), a light blocking layer 302 is formed and patterned on a substrate 301, and a silicon nitride film 303 and a silicon oxide film 304 are formed as the underlying films. Next, a film 305 made of a non-crystalline silicon is formed. The methods of forming these films are similar to the methods described earlier with reference to FIG. 2(A). Here, the thickness of the film 305 is, for example, 55 nm in the present preferred embodiment.

Next, as shown in FIG. 6(B), a photo resist is coated on the film 305 and patterned to obtain a resist mask 306 covering a portion of the film 305 (a region including the portion to become the active region of the TFD).

Here, the photo resist may be patterned by exposing the photo resist from the back face side of the substrate 301 (a back side exposure) by taking advantage of the light blocking layer 302 as described for the second preferred embodiment (FIG. 4(B)).

Next, as shown in FIG. 6(C), a portion of the film 305 that is not covered by the resist mask 306 is made thinner by dry or wet etching (half etch). As a result, a non-crystalline silicon film 307 having a partially different thickness is obtained.

A portion 307a of the non-crystalline silicon film 307 not covered by the resist mask 306 is, for example, approximately 5 nm to 10 nm thinner than a portion 307b covered by the resist mask 306. In this example, the amount etched is 5 nm. Therefore, the thin portion 307a of the non-crystalline silicon film 307 is 50 nm in thickness, which is 5 nm thinner than the thick portion 307b (thickness: 55 nm). Then the resist mask 306 is stripped off.

Next, as shown in FIG. 6(D), a laser beam 308 is irradiated on the non-crystalline silicon film 307 from above. Here, an XeCl excimer laser beam of 308 nm in wavelength is used as the laser beam 308. Furthermore, the beam size of the laser beam 308 is formed in such a way as to take an elongated shape at the surface of the substrate 301, and a progressive scanning is conducted in a direction orthogonal to the elongated direction to crystallize the entire substrate surface. As a result, the non-crystalline silicon film 307 is crystallized, and a crystalline silicon film 309 is obtained. In the present preferred embodiment also, similar to the preferred embodiments described earlier, the surface of a crystalline portion 309b, which results from the crystallization of the thick portion 307b of the non-crystalline silicon film 307, is rougher than the surface of a crystalline portion 309a, resulting from the crystallization of the thin portion 307a of the non-crystalline silicon film 307.

Then, as shown in FIG. 6(E), a semiconductor layer 310, which is later to become the active region of the TFT, is formed using the region 309a of the crystalline silicon film 309, and a semiconductor layer 311, which is later to become the active region of the TFD, is formed using the region 309b.

Although not shown in the figures, a TFT and a TFD are created using the semiconductor layers 310 and 311, respectively, using a method similar to the method described earlier with reference to FIG. 2(E) through FIG. 3(H) for the first preferred embodiment.

The effects similar to those of the first preferred embodiment are achieved with the present preferred embodiment. Furthermore, because the non-crystalline silicon film is formed with only one process step in the present preferred embodiment, the number of manufacturing steps is reduced by one, compared with the first preferred embodiment, in which the non-crystalline silicon film of a double layer structure is formed.

The thickness of the non-crystalline silicon film is made partially different by taking advantage of a film deposition process by the CVD method in the first and second preferred embodiments described earlier and using an etching (half etch) method in the present preferred embodiment. The method used, which is either the CVD or etching, may be chosen by considering the across-the-substrate surface non-uniformity in thickness in the thick portion and the thin portion of the non-crystalline silicon film, respectively. The use of a method that better reduces the aforementioned non-uniformity in thickness leads to a reduced product-to-product variation in device characteristics, thereby resulting in even higher reliability.

Fourth Preferred Embodiment

A fourth preferred embodiment of the semiconductor device of the present invention will be described next. In order to describe the basic embodiments of the present invention in an easy-to-understand way, the methods of manufacturing the semiconductor devices of the simplest structures were described with the examples in which the n channel type TFTs and the photo sensor TFDs were formed on the same substrate for the previously described first through third preferred embodiments. Here, a method of manufacturing a semiconductor device, which has on the same substrate a plurality of TFTs and TFDs of a conductive type or having different structures and which may be used in electronic systems having a photo sensor portion and a display portion, will be explained.

The semiconductor device of the present preferred embodiment is an active matrix substrate for a display device having a photo sensing feature and includes on the same substrate a circuit portion having a plurality of TFTs, a pixel portion (also called a display region) having a plurality of pixels, and a photo sensor portion including a photo sensor TFD.

The circuit portion includes n-channel TFTs and p-channel TFTs. The TFT used as the n-channel TFT in the present preferred embodiment has a GOLD (gate overlapped LDD) structure offering high reliability against hot carrier degradation. The TFT having no LDD region, or so-called the single drain structure TFT, is used as the p-channel TFT.

The pixel portion includes a TFT (pixel TFT) functioning as a switching device and a supplemental capacitance connected to it in each pixel. The TFT with the LDD structure, having an LDD region, which is offset toward the source drain regions from the gate electrode, is used as the pixel TFT in order to reduce the off currents. Furthermore, a dual gate structure, in which two gate electrodes are laid out in series with respect to one semiconductor layer, is preferably used in order to spread out the voltage applied between the source and the drain and to more effectively control the off currents.

In the present preferred embodiment, the semiconductor layers (active regions) of the aforementioned TFT and TFD are formed using a crystalline semiconductor film obtained by crystallizing the same non-crystalline semiconductor film. Furthermore, the region of the non-crystalline semiconductor film that is to become the semiconductor layer for the TFD is selectively made thicker, and the resulting difference in thicknesses is used for making the surface of the region of the non-crystalline semiconductor film, which is to become the semiconductor layer of the TFD, rougher than the surface of the other region (the region to become the semiconductor layer of the TFT) during a crystallization process. Therefore, the semiconductor layer of the n channel TFT, the semiconductor layer of the p channel TFT, the semiconductor layer of the pixel TFT, and the semiconductor layer to become the lower electrode of the supplemental capacitance are all configured to be thinner than the semiconductor layer of the photo sensor TFD and to have surfaces which are smoother than the surface of the semiconductor layer of the photo sensor TFD.

Any one of the methods described earlier for the preferred embodiments 1 through 3 may be applied for forming the semiconductor layers having different thicknesses and different levels of surface roughness. As an example, a specific method of manufacturing the aforementioned semiconductor device by applying the method of the second preferred embodiment (FIG. 4 through FIG. 5) will be described next.

Figure 7:
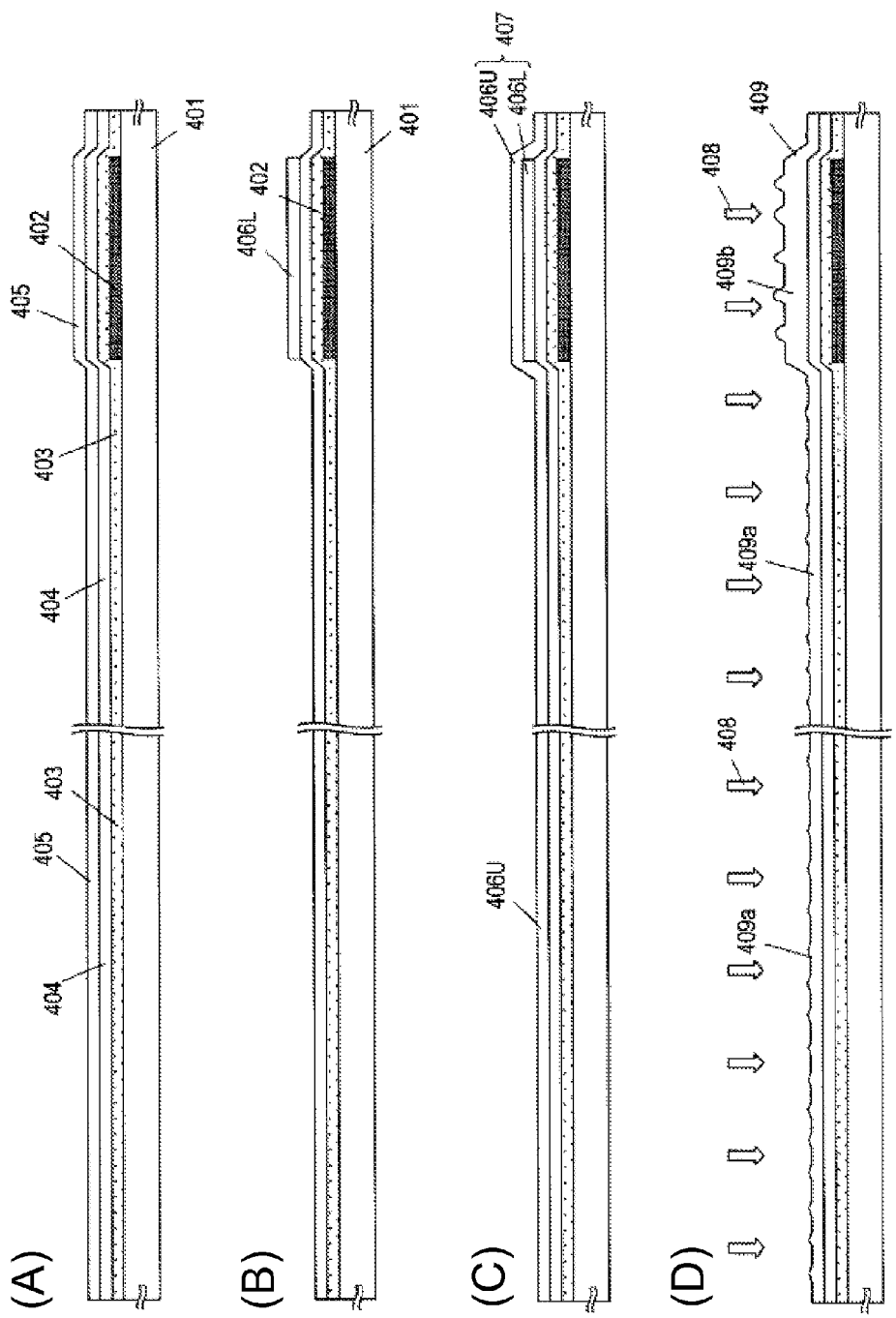
FIG. 7(A) through FIG. 7(D) are cross-sectional schematics of a manufacturing process for a semiconductor device of a fourth preferred embodiment of the present invention.

First, as shown in FIG. 7(A), a light blocking layer 402 is formed and patterned on a substrate 401, and then a silicon nitride film 403 and a silicon oxide film 404 are formed as the underlying films. Next, a film 405 made of non-crystalline semiconductor (non-crystalline silicon) is formed. The methods of forming these films are similar to the methods described above with reference to FIG. 2(A). Here, the thickness of the film 405 made of non-crystalline silicon is, for example, 10 nm.

Next, as shown in FIG. 7(B), the film 405 is patterned to form an island of a lower layer film 406L made of non-crystalline silicon in a region of the substrate 401 in which the TFD is to be formed. The film 405 may be patterned, for example, with a back side exposure using the patterns on the light blocking layer 402 in a method similar to those described with reference to FIG. 4(B) through FIG. 4(D).

Then, as shown in FIG. 7(C), an upper layer film 406U made of non-crystalline silicon is formed across the entire surface of the substrate 401 over the lower layer film 406L. As a result, a non-crystalline silicon film 407 made of the lower layer film 406L and the upper layer film 406U is obtained. The thickness of the upper layer film 406U is, for example, 45 nm. Therefore, the non-crystalline silicon film 407 is thicker in the region in which the TFD is to be formed compared with the region in which the TFT and the supplemental capacitance are to be formed by an amount corresponding to the thickness of the lower layer film 406L. In the present preferred embodiment, the thick portion of the non-crystalline silicon film 407 is 55 nm in thickness (the total thickness of the lower layer film 406L and the upper layer film 406U), and the thin portion is 45 nm in thickness (thickness only of the upper layer film 406U).

Next, as shown in FIG. 7(D), a laser beam 408 is irradiated on the non-crystalline silicon film 407 from above the substrate 401 for crystallization, and a crystalline silicon film 409 is obtained. In the present preferred embodiment, an XeCl excimer laser beam of 308 nm in wavelength is used as the laser beam 408. Furthermore, the beam size of the laser beam 408 is formed in such a way as to take an elongated shape on the surface of the substrate 401, and a progressive scanning is conducted in a direction orthogonal to the elongated direction to irradiate the entire substrate surface.

Here, the surface of a crystalline portion 409b, resulting from crystallizing the thick portion of the non-crystalline silicon film 407, is rougher than the surface of a crystalline portion 409a, resulting from crystallizing the thin portion. This is because the larger the volume (thickness) of the semiconductor film, the larger the ridges created due to the difference in volumes between the melted state and the solid state. Therefore, as shown in the figures, the average height of the ridges formed on the surface of the thick crystalline portion 409b is larger than the average height of the ridges formed on the surface of the thin crystalline portion 409a.

Figure 8:
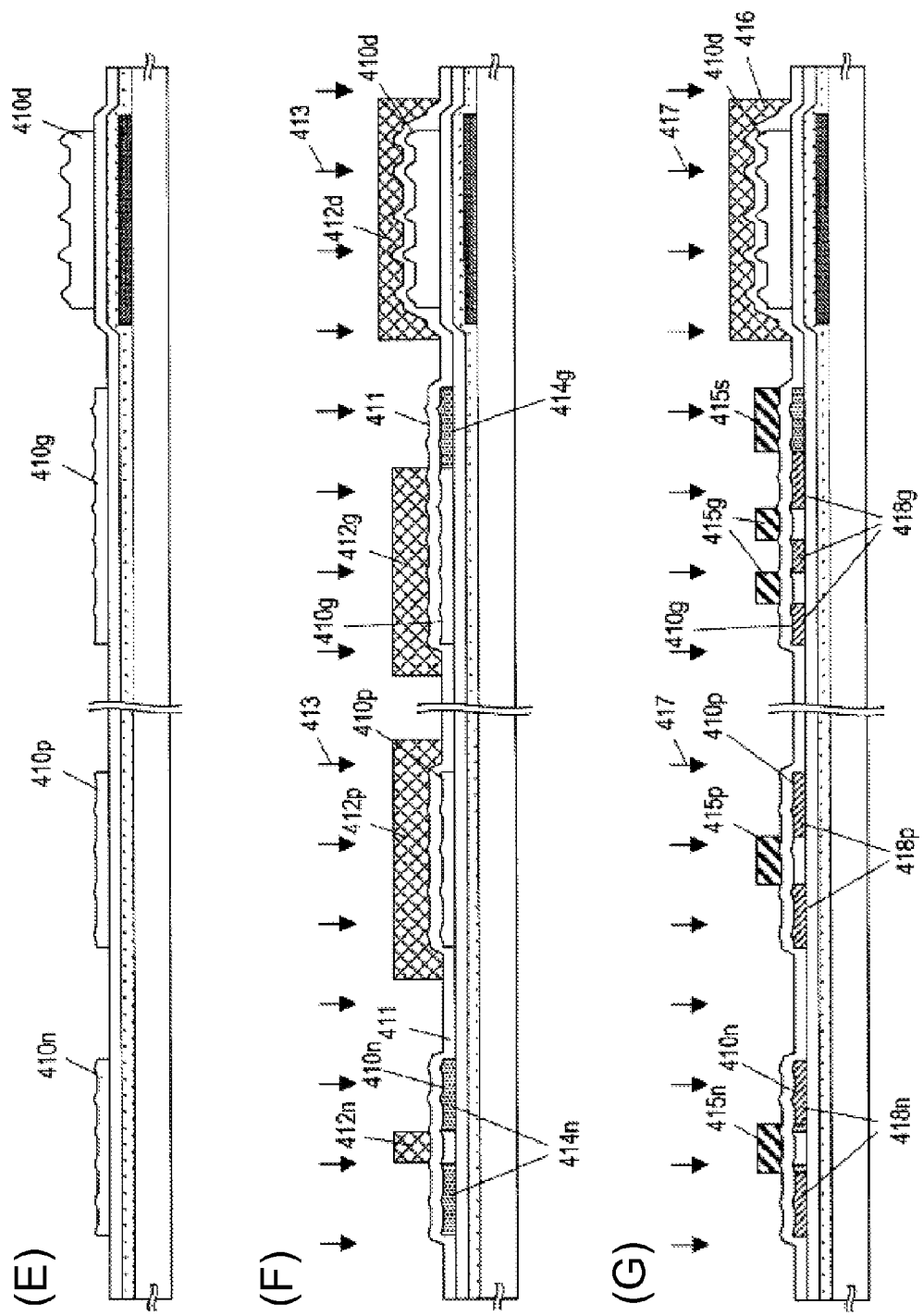
FIG. 8(E) through FIG. 8(G) are cross-sectional schematics of a manufacturing process for a semiconductor device of the fourth preferred embodiment of the present invention.

Next, as shown in FIG. 8(E), the thin crystalline portions 409a of the crystalline silicon film 409 are used for forming a semiconductor layer 410n, which is later to become the active region of the n channel TFT, a semiconductor layer 410p, which is later to become the active region of the p channel TFT, and a semiconductor layer 410g, which is later to become the active region of the pixel TFT and the lower electrode of the supplemental capacitance. Furthermore, the thick crystalline portion 409b is used for forming a semiconductor layer 410d later to become the active region of the photo sensor TFD.

Next, as shown in FIG. 8(F), a gate insulating film 411 is formed in such a way as to cover the semiconductor layers 410n, 410p, 410g, and 410d. Then, doping masks 412n, 412p, 412g, and 412d are formed using a photo resist over the gate insulating film 411. The doping mask 412n is laid out to cover the portion of the semiconductor layer 410n to become the channel region. The doping mask 412g is placed to cover the semiconductor layer 410g except for the portion to become the supplemental capacitance. The doping masks 412p and 412d are, respectively, placed to cover the entire semiconductor layers 410p and 410d.

In this state, a first low-concentration n type impurity (phosphorous) 413 is doped into portions of the semiconductor layers 410n and 410g that are not covered by the doping masks 412n and 412g. A doping gas used is phosphine ($PH_3$), the acceleration voltage is 60-90 kV and is, for example, 70 kV, and the dose is $1\times10^{12}$ to $1\times10^{14}$ to $1\times10^{-2}$ and is, for example, $2\times10^{13}$ cm$^{-2}$. As a result, a first low concentration n type regions 414n are formed in portions of the semiconductor layer 410n, which is to become the active region of the n channel TFT (the portions to become the source and drain regions and the LDD region). Furthermore, a first low concentration n type region 414g is formed in a portion (the portion to become the supplemental capacitance) of the semiconductor layer 410g, which is to become the active region of the pixel TFT and the supplemental capacitance. The low concentration phosphorous 413 is not implanted in any other regions.

Next, the doping masks 412n, 412p, 412g, and 412d are stripped off, and then, as shown in FIG. 8(G), the gate electrodes 415n and 415p are formed over the semiconductor layers 410n and 410p, respectively, and two gate electrodes 415g and an upper electrode 415s of the supplemental capacitance are formed over the semiconductor layer 410g. Then, a resist mask 416 is formed to cover the entire semiconductor layer 410d of the TFD.

The gate electrode 415n is placed in such a way as to overlap a portion of the semiconductor layer 410n, which is to become the channel region, and portions of the low concentration n type regions 414n on its both sides. The gate electrode 415p is placed in such a way as to overlap a portion of the semiconductor layer 410p, which is to become the channel region. The gate electrodes 415g are placed in such a way as to overlap respectively with the two portions of the semiconductor layer 410g, which are to become the channel regions.

In this state, the semiconductor layers 410n, 410p, and 410g are doped at a low concentration level with a second n type impurity (phosphorous) 417. The doping gas used is phosphine (PH$_3$), the acceleration voltage is 60-90 kV and is, for example, 70 kV, and the dose is $1\times10^{12}$ to $1\times10^{14}$ cm$^{-2}$ and is, for example, $2\times10^{13}$ cm$^{-2}$. As a result, second low concentration n type regions 418n, 418p, and 418g are formed, respectively, in the portions of the semiconductor layers 410n, 410p, and 410g, which are not covered by the gate electrodes 415n, 415p, and 415g and by the upper electrode 415s.

Figure 9:
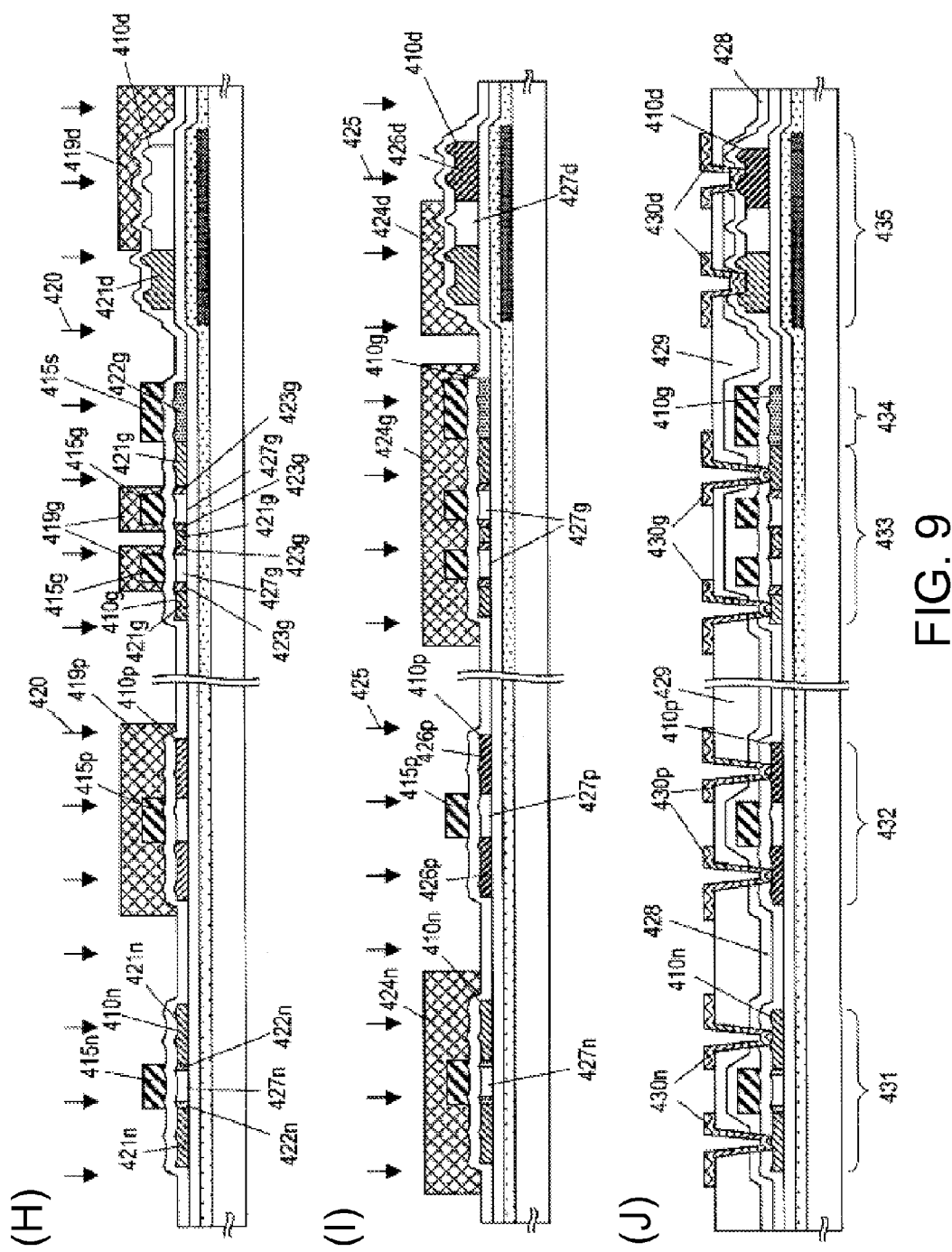
FIG. 9(H) through FIG. 9(J) are cross-sectional schematics of a manufacturing process for a semiconductor device of the fourth preferred embodiment of the present invention.

After the resist mask 416 is stripped off, as shown in FIG. 9(H), new resist masks 419p, 419g, and 419d are formed over the semiconductor layers 410p, 410g, and 410d, respectively. The resist mask 419p is formed to cover the entire semiconductor layer 410p. The resist mask 419g is placed in such a way as to cover each of the gate electrodes 419g over the semiconductor layer 410g and portions of the second low concentration n type region 418g, which are located on both ends of each of the gate electrodes 419g. The resist mask 419d is placed to cover the semiconductor layer 410d, except for the portion to become the n type region.

In this state, an n type impurity (phosphorous) 420 is doped at a high concentration level. The doping gas is phosphine (PH$_3$), the acceleration voltage is 60-90 kV and is, for example, 70 kV, and the dose is $1\times10^{15}$ to $1\times10^{16}$ cm$^{-2}$ and is, for example, $5\times10^{15}$ cm$^{-2}$. As a result, source and drain regions 421n are formed in portions of the semiconductor layer 410n that are to become the active region of the n channel TFT but not covered by the gate electrode 415n, and the portion of the second low concentration n type region that is covered by the gate electrode 415n and not implanted with phosphorous 420 becomes a GOLD region 422n. A portion that is sandwiched between the GOLD regions 422n and is not implanted with phosphorous or boron becomes a channel region 427n. Furthermore, the semiconductor layer 410p, which is to become the active region of the p channel TFT, is not implanted with phosphorous 420. On the other hand, the portions of the semiconductor layer 410g to become the active region of the pixel TFT and the supplemental capacitance that are not covered by the resist mask 419g and are implanted with phosphorous 420 at the high concentration level becomes the source and drain regions 421g. The portions of the second low concentration n type region that are covered by the resist mask 419g and are not implanted with the phosphorous 420 becomes LDD regions 423g. Furthermore, the portions of the semiconductor layer 410g that are covered by the gate electrodes 415g become the channel regions 427g, and the portion covered by the upper electrode 415s remains as the first low concentration n type region and becomes the lower electrode 422g for the capacitor. Furthermore, in the semiconductor layer 410d, which is to become the active region of the TFD, an n type region 421d is formed in the portion that is not covered by the resist mask 419d.

In the present specification, the LDD region, over which the gate electrode overlaps, is called the GOLD region, and the LDD region, over which the gate electrode does not overlap (which is offset), is simply called the LDD region to make a distinction.

Next, the resist masks 419p, 419g, and 419d are stripped off, and, as shown in FIG. 9(I), new resist masks 424n, 424g, and 424d are formed over the semiconductor layers 410n, 410g, and 410d. The resist masks 424n and 424g are formed to cover the entire semiconductor layers 410n and 410g. The resist mask 424d is placed to cover the semiconductor layer 410d, except for the portion to become the p type region.

In this state, a p-type impurity (boron) 425 is doped at a high concentration level. The doping gas used is diborane (B$_2$H$_6$), the acceleration voltage is 40 kV to 90 kV and is, for example, 75 kV, and the dose is $1\times10^{15}$ to $1\times10^{16}$ cm$^{-2}$ and is, for example, $3\times10^{15}$ cm$^{-2}$. As a result, source and drain regions 426p are formed in the semiconductor layer 410p, which is to become the active region of the p channel TFT, except for the portion covered by the gate electrode 415p. The portion of the semiconductor layer 410p that is covered by the gate electrodes 415p and is not implanted with the boron 425 becomes the channel region 427p. The high concentration boron 425 is not implanted into the semiconductor layers 410n and 410g. The high concentration boron 425 is implanted into a portion of the semiconductor layer 410d for the TFD, and a p-type region 426d is formed. The portion of the semiconductor layer 410d that is not implanted with phosphorous or boron becomes an intrinsic region 427d.

Next, after the resist masks 424n, 424g, and 424d are stripped off, an anneal treatment is conducted for activating the impurities (phosphorous and boron) implanted into the respective semiconductor layers. The method and conditions for the activation treatment may be similar to the method and conditions described for the first preferred embodiment (FIG. 3(G)), for example.

Next, as shown in FIG. 9(J), a silicon nitride film 428 and a silicon oxide film 429 are formed in the order mentioned as interlayer insulating films. An anneal treatment for hydrogenation may be conducted as needed. Then, using a method similar to the method described earlier with reference to FIG. 3(H), contact holes are formed in the interlayer insulating films 428 and 429, and the electrodes and wiring lines 430n, 430p, 430g and 430d are formed.

The n channel thin film transistor 431, p channel thin film transistor 432, thin film transistor 433 for the pixel, supplemental capacitance 434, and thin film diode 435 are thus obtained. Here, the contact holes may also be created over the gate electrodes of the thin film transistors 431 and 432, which make up the circuits, so that the gate electrodes may be connected to the source or drain region or the gate electrode of the other TFTs on the substrate using the source and drain wiring lines. Furthermore, a protective film may be formed above these devices as needed.

Similar to the preferred embodiments described earlier, the surface of the semiconductor layer of the thin film diode 435 is rougher than the surface of the semiconductor layer of the thin film transistors 431 through 433 in the present preferred embodiment, and as a result, the reflection of incident light off of the surface of the semiconductor layer is suppressed. Furthermore, because the semiconductor layer of the thin film diode 435 is thicker than the semiconductor layers of the thin film transistors 431 through 433, a higher rate of optical absorption is achieved. This also has an effect of enhancing the sensitivity toward light, and as a result, the photo current is increased, and the SN ratio is improved.

Furthermore, because the semiconductor layers for the thin film transistors 431 through 433 have a smaller thickness and less roughness, the following effects are achieved.

Leakage current in the off state of the thin film transistor 433, which is the pixel TFT, is suppressed. Therefore, spots and roughness in the display, caused by the leakage current, are suppressed, and the failures caused by, for example, point defects, are reduced. Reliability related to the breakdown characteristics of the gate insulating film and gate bias stress is improved with the thin film transistors 431 and 432 that make up the driver circuit. Furthermore, the subthreshold characteristics and the field effect mobility are also enhanced, and the drive capability of the driver circuit is improved.

Furthermore, because the semiconductor layer making up the lower electrode of the supplemental capacitance 434 is thin and has limited roughness, the breakdown characteristics of the supplemental capacitance are improved, and the failure rate caused by point defects or the like due to leakage in the supplemental capacitance 434 is reduced.

Accordingly, the semiconductor layers of the thin film transistors 431 through 433 and the semiconductor layer of the thin film diode (photo sensor TFD) 435 are optimized for their respective applications and requirements to achieve all of the device characteristics required in the present preferred embodiment. As a result, a high quality display with high detection sensitivity is achieved, and a small and ideal interactive display device is provided with minimal non-display region size.

Furthermore, according to the manufacturing method of the present preferred embodiment, the display device such as the aforementioned can be manufactured at low cost with a fewer process steps. More specifically, because the doping process for forming the source and drain regions of the thin film transistors 431 through 433 and the doping process for forming the n type region or the p type region of the thin film diode 435 are performed simultaneously in the aforementioned method, the manufacturing process is that much more simplified. Furthermore, there is a further advantage in that when the p channel and n channel thin film transistors 431 and 432 are to be formed simultaneously (TFT with CMOS structure), the n type impurity doping process for the thin film diode 435 and the thin film transistor 431 can take place simultaneously, and the p type impurity doping step for the thin film diode 435 and the thin film transistor 432 can take place simultaneously.

Fifth Preferred Embodiment

Display devices having a sensor feature will be described in the present preferred embodiment. These display devices are made with the semiconductor devices of one of the preferred embodiments described above.

A display device having the sensor feature of the present preferred embodiment is, for example, a liquid crystal display device with a touch sensor and includes a display region and a frame region positioned at the periphery of the display region. The display region includes a plurality of display portions (pixels) and a plurality of photo sensor portions. Each display portion includes a pixel electrode and a TFT for pixel switching, and each photo sensor portion includes a TFD. Driver circuit for the display is formed in the frame region for driving each display portion, and TFTs for the driver circuit is used for the driver circuit. The TFTs for pixel switching and TFTs for the driver circuit and the TFD for the photo sensor portion are formed on the same substrate using the method such as those described in the preferred embodiments 1 through 4. In the display device of the present invention, among the TFTs used in the display device, at least the TFTs for pixel switching need to be formed on the same substrate as the TFD of the photo sensor portion by the aforementioned method. The driver circuit, for example, may be formed separately on another substrate.

In the present preferred embodiment, the photo sensor portion is placed adjacent to the corresponding display portion (for example, a primary color pixel). One photo sensor portion may be placed for each display portion, or a plurality of photo sensor portions may be placed. Or, a single photo sensor portion may be placed for a set of a plurality of display portions. For example, one photo sensor portion may be formed with respect to a color display pixel made of three primary color (RGB) pixels. Therefore, an appropriate number of photo sensor portions (density) may be selected with respect to the number of display portions according to the resolution.

When a color filter is placed on the observer side of the photo sensor portion, the sensitivity of the TFD which makes up the photo sensor portion may go down. For this reason, the color filter preferably is not formed on the observer side of the photo sensor portion.

Here, the structure of the display device of the present embodiment is not limited to the above. For example, the TFD for the photo sensor may be placed in the frame region and the brightness of the display may be controlled according to the brightness of the ambient light to construct a display device including an ambient light sensor. Furthermore, the color filter may be formed on the observer side of the photo sensor portion in order to have the photo sensor portion pick up light coming through the color filter and function as a color image sensor.

A structure of the display device according to the present preferred embodiment will be described below with reference to the figures with an example of a touch screen liquid crystal display device including a touch screen sensor.

Figure 10:
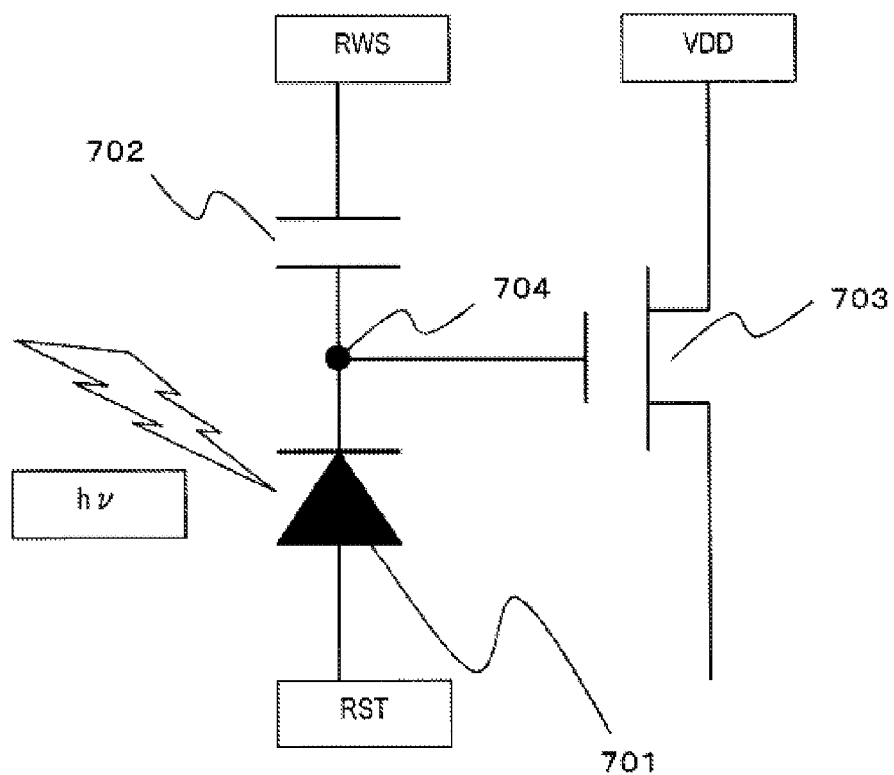
FIG. 10 is a circuit diagram of a photo sensor TFD of a fifth preferred embodiment of the present invention.

FIG. 10 is a circuit diagram showing an example of the structure of the photo sensor portion placed in the display region. The photo sensor portion includes a thin film diode 701 for photo detection, a capacitor 702 for storing the signals, and a thin film transistor 703 for accessing the signals stored in the capacitor 702. The RST signal comes in, and the RST voltage is written at the node 704. Then, the voltage at the node 704 goes down with leakage under light, and the gate voltage of the thin film transistor 703 changes and opens/closes the TFT gate. As a result, the signal VDD is transmitted as an output.

Figure 11:
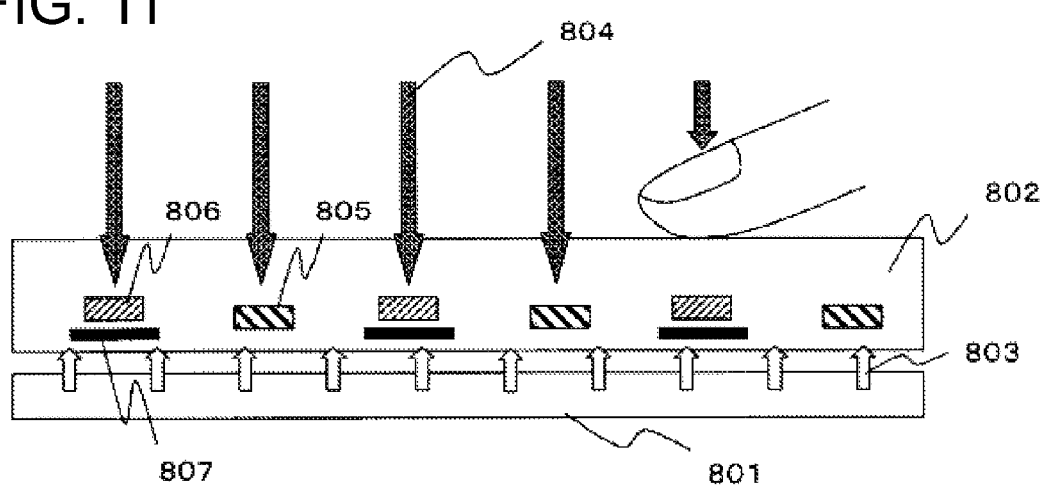
FIG. 11 is a structural diagram of a touch screen of the photo sensing method of the fifth preferred embodiment of the present invention.

FIG. 11 is a cross-sectional schematic showing an example of the active matrix touch screen liquid crystal display device. In this example, one optical touch sensor portion, including the photo sensor portion, is placed for each pixel.

The liquid crystal display device shown in the figure includes a liquid crystal module 802 and a backlight 801 placed on the back face side of the liquid crystal module 802. Although not shown in the figure, the liquid crystal module 802 is made of, for example, a rear substrate which is optically transparent, a front substrate placed in such a way as to face the rear substrate, and a liquid crystal layer formed between these substrates. The liquid crystal module 802 has a plurality of display portions (primary color pixels), and each display portion includes a pixel electrode (not shown in the figure) and a thin film transistor 805 for pixel switching connected to the pixel electrode. Furthermore, a photo touch sensor portion including a thin film diode 806 is placed adjacent to each display portion. Although not shown in the figure, a color filter is placed on the observer side of each of the display portions. The color filter, however, is not formed on the observer side of the photo touch sensor portions. A light blocking layer 807 is placed between the thin film diode 806 and the backlight 801, and the light from the backlight 801 is blocked by the light blocking layer 807 and does not hit the thin film diode 806. Only the ambient light 804 hits the thin film diode 806. The photo sensing touch screen is realized with the thin film diode 806 sensing the incoming ambient light 804. Here, the light blocking layer 807 only needs to be placed in such a way that the light from the back light 801 does not hit at least the intrinsic region of the thin film diode 806.

Figure 12:
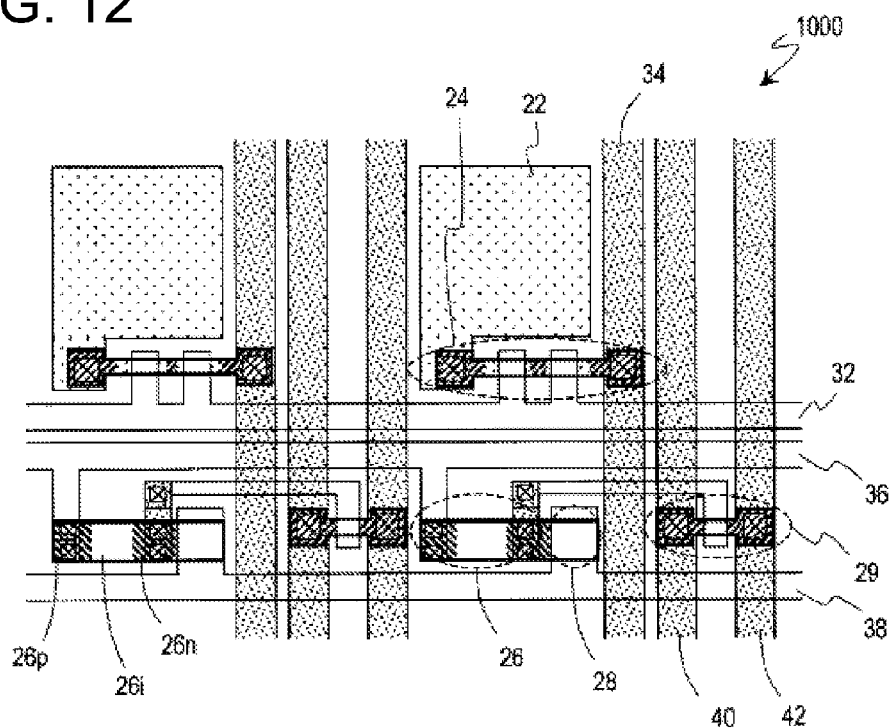
FIG. 12 is a plan view schematic showing an example of the rear substrate in the liquid crystal display device of the touch screen method of the fifth preferred embodiment of the present invention.

FIG. 12 is a schematic plan view showing an example of the rear substrate in the active matrix touch screen liquid crystal display device. Although the liquid crystal display device of the present preferred embodiment includes a plurality of pixels (R, G, and B pixels), only two pixels are shown here for the sake of simplicity.

A rear substrate 1000 includes a plurality of display portions (pixels), each of which has a pixel electrode 22 and a thin film transistor 24 for pixel switching, and photo touch sensor portions, which are placed adjacent to respective display portions and include a photo sensor photo diode 26, a capacitor 28 for signal storage, and a follower thin film transistor 29 for photo detection.

The thin film transistor 24 has a structure similar to the TFT described in, for example, the fourth preferred embodiment and has a dual gate LDD structure having two gate electrodes and LDD regions. The source region of the thin film transistor 24 is connected to a source bus line 34 for the pixel, and the drain region is connected to the pixel electrode 22. The thin film transistor 24 is turned on and off by signals from a gate bus line 32 for the pixels. Accordingly, voltage is applied on the liquid crystal layer by the pixel electrode 22 and an opposing electrode formed on the front substrate, which is placed to face the rear substrate 1000 in order to change the orientation state of the liquid crystal layer to achieve the display.

On the other hand, the photo sensor photo diode 26 has a structure similar to the TFD described in, for example, the fourth preferred embodiment and includes a p+ region 26p, n+ region 26n, and an intrinsic region 26i located between these regions 26p and 26n. The capacitor 28 for signal storage includes the electrodes made of the gate electrode layer and the silicon layer and forms a capacitor using the gate insulating film. The p+ region 26p in the photo sensor photo diode 26 is connected to an RST signal line 36 for the photo sensor, and the n+ region 26n is connected to the lower electrode (silicon layer) in the capacitor 28 for signal storage and connected to an RWS signal line 38 for the photo sensor through this capacitor 28. Furthermore, the n+ region 26n is connected to the gate electrode layer in the follower thin film transistor 29 for the photo sensor. The source and drain regions of the follower thin film transistor 29 for the photo sensor are respectively connected to a VDD signal line 40 for the photo sensor and a COL signal line 42 for the photo sensor.

Accordingly, the photo sensor photo diode 26, capacitor 28 for signal storage, and follower thin film transistor 29 for photo detection, respectively, correspond to the thin film diode 701, capacitor 702, and thin film transistor 703 of the driver circuit shown in FIG. 10 and make up the driver circuit for the photo sensor. The operation of this driver circuit will be described next when light is detected.

(1) First, the RWS signal is written into the capacitor 28 for signal storage through the RWS signal line 38. As a result, a positive electric field is generated on the side of the n+ region 26n in the photo sensor photo diode 26, and the photo sensor photo diode 26 goes into a reverse bias state. (2) An optical leakage in the photo sensor photo diode 26, which is present in a region of the substrate surface under the radiation of light, causes a charge to flow toward the RST signal line 36. (3) As a result, the potential level of the side of the n+ region 26n drops, and a change in the voltage causes a change in the gate voltage applied on the follower thin film transistor 29 for photo detection. (4) The VDD signal is applied on the source side of the follower thin film transistor 29 for the photo dection through a VDD signal line 40. When the gate voltage changes as described above, the magnitude of the current flowing to a COL signal line 42 connected to the drain side changes, and the resulting electrical signal can be extracted as an output on the COL signal line 42. (5) The RST signal is written into the photo sensor photo diode 26 through the COL signal line 42 to reset the potential level of the capacitor 28 for signal storage. Photo detecting is made possible through the scanning and repetition of the aforementioned operations (1) through (5).

The structure of the rear substrate in the touch screen liquid crystal display device of the present preferred embodiment is not limited to the structure shown in FIG. 12. For example, a supplemental capacitance (CS) may be formed for each pixel switching TFT. Furthermore, while the optical touch sensor portion is formed adjacent to each of the RGB pixels in the example shown in the figure, one optical touch sensor portion may be placed with respect to a set of three pixels made up of the RGB pixels (color display pixels) as mentioned earlier.

Returning to FIG. 11, as shown in the cross-sectional diagram in FIG. 11, the thin film diode 806 in the example described above is placed in the display region and used as a touch sensor. However, the thin film diode 806 may be formed outside of the display region and may be used as an ambient light sensor for controlling the brightness of the backlight 801 in accordance to the luminance of the ambient light 804.

Figure 13:
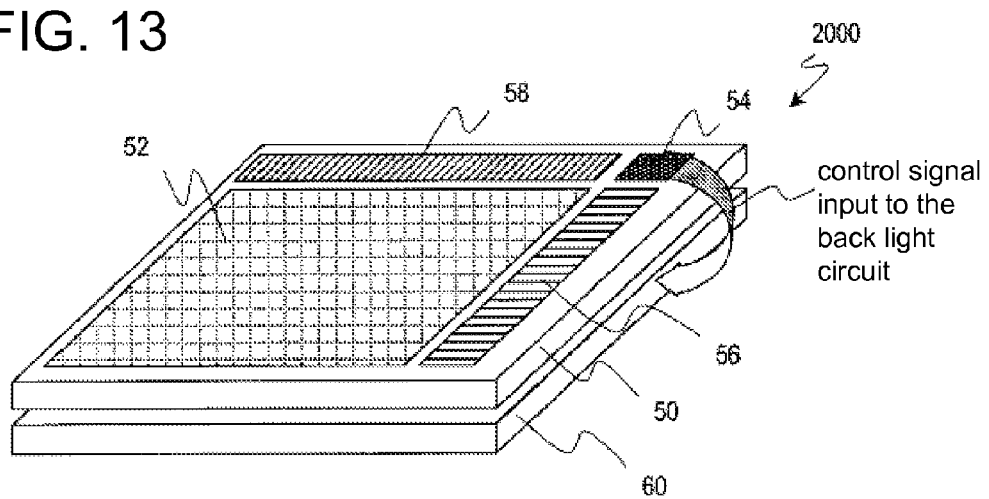
FIG. 13 is a perspective view diagram showing an example of the liquid crystal display device having an ambient light sensor of the fifth preferred embodiment of the present invention.

FIG. 13 is a perspective view showing an example of a liquid crystal display device with an ambient light sensor. A liquid crystal display device 2000 includes an LCD substrate 50 having a display region 52, a gate driver 56, a source driver 58, and a photo sensor portion 54, and a backlight 60 placed on the back side of the LCD substrate 50. The region of the LCD substrate 50 located at the peripheral of the display region 52 and in which the drivers 56 and 58 and the photo sensor portion 54 are placed is sometimes referred to as the frame region.

The brightness of the backlight 60 is controlled by the backlight control circuit (not shown in the figure). Furthermore, although not shown in the figure, TFTs are used for the display region 52 and for the drivers 56 and 58, and TFDs are used for the photo sensor portion 54. The photo sensor portion 54 generates brightness signals based on the luminance of the ambient light and inputs them to the backlight control circuit via connections using a flexible board. The backlight control circuit generates the backlight control signals based on these luminance signals and outputs them to the backlight 60.

The present invention can also be used to constitute an organic EL display device with an ambient light sensor. Such an organic EL display device may have a structure in which the display portion and the photo sensor portion are placed on the same substrate, similar to the liquid crystal display device shown in FIG. 13, but the backlight 60 does not need to be placed on the back side of the substrate. In such an instance, the photo sensor portion 54 is connected to the source driver 58 using the wiring lines formed on the substrate 50, and the luminance signals from the photo sensor portion 54 are fed as an input to the source driver 58. The source driver 58 changes the brightness of the display portion 52 based on the luminance signals.

While the specific preferred embodiments of the present invention have been described above, the present invention is not limited to the aforementioned preferred embodiments, and various modifications are possible based on the technological concepts of the present invention. Circuits for performing the analog drive and circuits for performing the digital drive may also be created at the same time on the glass substrate using the TFTs of the present invention. For example, the circuits performing the analog drive may include the driver circuit for the source side and the driver circuit for the pixels and the gate side, and the driver circuit for the source side may include shift registers, buffers, and sampling circuits (transfer gates), while the driver circuits for the gate side may include shift registers, level shifters, and buffers. Furthermore, level shifter circuits may be formed between the sampling circuits and the shift registers as needed. Furthermore, memory and microprocessors may also be formed using the manufacturing process of the present invention.

The present invention can provide a semiconductor device having TFTs and TFDs on the same substrate, which have excellent characteristics using the semiconductor films optimized for the respective semiconductor devices. As a result, using the same manufacturing process, it is possible to manufacture TFTs that have a high field effect mobility and a high on/off ratio as the TFTs in the driver circuits and as TFTs for switching the pixel electrodes, and the TFDs that are used as the photo sensors and have a low noise current and have a high SN ratio with respect to light (current ratio under bright and dark conditions). Device characteristics optimized for the respective semiconductor devices are realized particularly by optimizing the respective levels of surface roughness and thicknesses of the channel regions of the TFTs, which have a large impact on the field effect mobility, and of the intrinsic regions of the TFDs, which have a large impact on the photo sensitivity, among these semiconductor layers. Furthermore, the semiconductor device offering such high performance can be manufactured using a simpler method to achieve a smaller product form factor, higher performance, and lower cost.

INDUSTRIAL APPLICABILITY

The present invention can be widely applied on the semiconductor devices having TFTs and TFDs or electronics systems used in all fields and including such semiconductor devices. For example, the present invention may be applied to CMOS circuits or pixel portions of active matrix liquid crystal display devices or organic EL display devices. Such display devices may be used as the display screens in mobile phones and portable game machines and as monitors on digital cameras, for example. Therefore, the present invention is applicable to all electronics systems in which the liquid crystal display device or the organic EL display device is embedded.

The present invention can be used suitably particularly in display devices, such as the active matrix liquid crystal display device and organic EL display device; image sensors; photo sensors; and electronics systems that combine these. The present invention is particularly advantageous when applied to a display device having the photo detection feature, which uses the TFDs, or an electronics system having such a display device. Furthermore, the present invention can be applied to image sensors having a photo sensor using TFDs and a driver circuit using TFTs.

DESCRIPTION OF REFERENCE NUMERALS

101 substrate
102 light blocking layer
103, 104 underlying films
105L lower layer film made of non-crystalline silicon
105U upper layer film made of non-crystalline silicon
106 non-crystalline silicon film
108 crystalline silicon film
108a thin portion of the crystalline silicon film
108b thick portion of the crystalline silicon film
109, 110 islands of semiconductor layer
111 gate insulating film
112 gate electrode
113, 118 masks
114 n type impurity (phosphorous)
115 source and drain regions
116 n+ region
117 channel region
119 p type impurity (boron)
120 p+ region
121 intrinsic region
122, 123 interlayer insulating films
124 thin film transistor electrode and wiring line
125 thin film diode electrode and wiring line
126 thin film transistor
127 thin film diode

The invention claimed is:

1. A method of manufacturing a semiconductor device having a thin film transistor and a thin film diode on a same substrate, the method comprising:
   (a) forming a non-crystalline semiconductor film on a surface of said substrate, wherein said non-crystalline semiconductor film includes a first non-crystalline portion positioned in a region of the surface of said substrate in which the thin film transistor is to be formed and a second non-crystalline portion positioned in a region in which the thin film diode is to be formed, said second non-crystalline portion being thicker than said first non-crystalline portion;
   (b) obtaining a crystalline semiconductor film including a first crystalline portion, resulting from crystallizing said first non-crystalline portion of said non-crystalline semiconductor film, and a second crystalline portion, resulting from crystallizing said second non-crystalline portion and having a rougher surface than said first crystalline portion, by radiating a laser beam for crystallization on said non-crystalline semiconductor film; and
   (c) forming a first island of semiconductor layer, which is later to become an active region of the thin film transistor, and a second island of semiconductor layer, which is later to become an active region of the thin film diode, by patterning said crystalline semiconductor film, wherein said first island of semiconductor layer includes said first crystalline portion, and said second island of semiconductor layer includes said second crystalline portion, wherein said step (a) includes:
- (a1) forming a lower layer film made of non-crystalline semiconductor in the region of the surface of said substrate in which said thin film diode is to be formed; and
- (a2) forming an upper layer film made of non-crystalline semiconductor in such a way as to be in contact with a surface of said lower layer film in the region in which said thin film diode is to be formed and in the region in which said thin film transistor is to be formed, in order to obtain said non-crystalline semiconductor film including said lower layer film and said upper layer film, wherein said first non-crystalline portion includes said upper layer film and does not include said lower layer film, and said second non-crystalline portion includes said lower layer film and said upper layer film.

2. The method of manufacturing a semiconductor device according to claim 1, wherein said substrate has optical transmissivity, wherein said manufacturing method further includes, in advance of said step (a), forming a light blocking layer in a portion of said substrate that is beneath a region in which the second island of semiconductor layer is going to be an active region of the thin film diode, for blocking light incoming from a surface on an opposite side of said substrate, wherein said step (a1) includes:
- (a1-1) forming a film made of non-crystalline semiconductor on the substrate on which said light blocking layer is formed;
- (a1-2) forming a resist layer by forming a resist film one said film and exposing and developing it; and
- (a1-3) obtaining said lower layer film by etching said film using said resist layer as a mask, and wherein said step (a1-2) includes a step for exposing said resist film from the surface on said opposite side of said substrate using said light blocking layer as a mask.

3. A method of manufacturing a semiconductor device having a thin film transistor and a thin film diode on a same substrate, the method comprising:
- (a) forming a non-crystalline semiconductor film on a surface of said substrate, wherein said non-crystalline semiconductor film includes a first non-crystalline portion positioned in a region of the surface of said substrate in which the thin film transistor is to be formed and a second non-crystalline portion positioned in a region in which the thin film diode is to be formed, said second non-crystalline portion being thicker than said first non-crystalline portion;
- (b) obtaining a crystalline semiconductor film including a first crystalline portion, resulting from crystallizing said first non-crystalline portion of said non-crystalline semiconductor film, and a second crystalline portion, resulting from crystallizing said second non-crystalline portion and having a rougher surface than said first crystalline portion, by radiating a laser beam for crystallization on said non-crystalline semiconductor film; and
- (c) forming a first island of semiconductor layer, which is later to become an active region of the thin film transistor, and a second island of semiconductor layer, which is later to become an active region of the thin film diode, by patterning said crystalline semiconductor film, wherein said first island of semiconductor layer includes said first crystalline portion, and said second island of semiconductor layer includes said second crystalline portion, wherein said step (a) includes:
- (a11) forming a film made of non-crystalline semiconductor on the surface of said substrate in the region in which said thin film diode is to be formed and in the region in which said thin film transistor is to be formed;
- (a12) obtaining said non-crystalline semiconductor film by making a portion of said film located in the region in which said thin film transistor is to be formed thinner than a portion located in the region in which said thin film diode is to be formed, wherein said substrate has optical transmissivity, and wherein said method of manufacturing further includes, in advance of said step (a), forming a light blocking layer on said substrate in a portion underneath a region in which the second island of semiconductor layer is going to be an active region of the thin film diode, for blocking light incoming from a surface on an opposite side of said substrate;

wherein said step (a12) includes:
- (a12-1) forming a resist film over said film and exposing and developing it; and
- (a12-2) obtaining said non-crystalline semiconductor film by making the portion of said film not covered by said resist layer thinner;

wherein said step (a12-1) includes exposing said resist film from the surface on said opposite side of said substrate using said light blocking layer as a mask.

* * * * *